(12) United States Patent
Nakagawa

(10) Patent No.: US 8,271,119 B2
(45) Date of Patent: Sep. 18, 2012

(54) SUBSTRATE PROCESSING APPARATUS AND SUBSTRATE PROCESSING SYSTEM

(75) Inventor: Yoshihiko Nakagawa, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 356 days.

(21) Appl. No.: 12/382,350

(22) Filed: Mar. 13, 2009

(65) Prior Publication Data

US 2009/0235865 A1 Sep. 24, 2009

(30) Foreign Application Priority Data

Mar. 18, 2008 (JP) ................................. 2008-068744
Dec. 26, 2008 (JP) ................................. 2008-333129

(51) Int. Cl.
*G06F 19/00* (2011.01)
(52) U.S. Cl. ........................ 700/117; 118/696
(58) Field of Classification Search .......... 700/117–121; 118/696
See application file for complete search history.

(56) References Cited

U.S. PATENT DOCUMENTS

| 5,867,389 | A  | * | 2/1999  | Hamada et al. ............... 700/121 |
| 6,122,556 | A  |   | 9/2000  | Tochiori et al. |
| 6,445,969 | B1 | * | 9/2002  | Kenney et al. ................ 700/108 |
| 6,493,600 | B1 |   | 12/2002 | Kotoku |
| 6,629,009 | B1 | * | 9/2003  | Tamaki .......................... 700/108 |
| 6,804,572 | B1 | * | 10/2004 | Cooperberg et al. ......... 700/121 |
| 6,990,380 | B2 | * | 1/2006  | Yoshimoto et al. ............ 700/20 |
| 7,065,427 | B1 | * | 6/2006  | Dakshina-Murthy et al. ............................ 700/120 |
| 7,184,850 | B1 | * | 2/2007  | Logsdon et al. .............. 700/100 |
| 7,225,046 | B2 |   | 5/2007  | Saito et al. |
| 7,356,377 | B2 | * | 4/2008  | Schwarm ....................... 700/108 |
| 7,373,211 | B1 | * | 5/2008  | Logsdon et al. ................ 700/99 |
| 7,373,215 | B2 | * | 5/2008  | Cain et al. ..................... 700/121 |
| 7,415,317 | B2 | * | 8/2008  | Toyoshima et al. ........... 700/108 |
| 7,490,010 | B2 | * | 2/2009  | Osada ............................. 702/34 |

(Continued)

FOREIGN PATENT DOCUMENTS

JP        A-08-227835        9/1996

(Continued)

OTHER PUBLICATIONS

Office Action issued in corresponding Japanese Patent Application No. 2008-333129, mailed Feb. 25, 2010. (with English-language translation).

(Continued)

*Primary Examiner* — Ramesh Patel
*Assistant Examiner* — Anthony Whittington
(74) *Attorney, Agent, or Firm* — Oliff & Berridge, PLC

(57) ABSTRACT

To provide a substrate processing system which can cause different display portions to output different displays, and cause different operations to be carried out from different operation screens. A substrate processing system, on login information of a user being input from a main display device, refers to the login information, a user group parameter, with which is set a group to which the user belongs, and an authority parameter, which sets an authority of the group, and causes the main display device to display a main operation screen corresponding to the user, while it, on login information of a user being input from an external operating apparatus, causes an external display device to display an external parameter setting screen for setting an authority parameter of a group to which the user belongs, or to display an external operation screen corresponding to the group to which the user belongs.

18 Claims, 17 Drawing Sheets

U.S. PATENT DOCUMENTS

| | | | |
|---|---|---|---|
| 7,505,879 B2* | 3/2009 | Tomoyasu et al. | 703/2 |
| 7,738,983 B2* | 6/2010 | Yamaji et al. | 700/100 |
| 7,774,082 B2* | 8/2010 | Kubota et al. | 700/110 |
| 7,818,085 B1* | 10/2010 | Chang | 700/121 |
| 2002/0161468 A1* | 10/2002 | Liu | 700/117 |
| 2003/0149506 A1* | 8/2003 | Haanstra et al. | 700/121 |
| 2004/0262290 A1* | 12/2004 | Haanstra et al. | 219/490 |
| 2005/0010319 A1* | 1/2005 | Patel et al. | 700/121 |
| 2005/0071039 A1* | 3/2005 | Mitrovic | 700/121 |
| 2005/0278057 A1* | 12/2005 | Cooperberg et al. | 700/121 |
| 2006/0003592 A1* | 1/2006 | Gale et al. | 438/745 |
| 2006/0052889 A1* | 3/2006 | Burda et al. | 700/96 |
| 2007/0010906 A1* | 1/2007 | Abe | 700/121 |
| 2007/0122920 A1* | 5/2007 | Bornstein et al. | 438/5 |
| 2007/0135957 A1* | 6/2007 | Ogawa et al. | 700/109 |
| 2007/0142950 A1* | 6/2007 | Okita | 700/108 |
| 2007/0169694 A1* | 7/2007 | Schwarm et al. | 118/665 |
| 2007/0179658 A1* | 8/2007 | Hamada | 700/121 |
| 2007/0265725 A1* | 11/2007 | Liu et al. | 700/121 |
| 2008/0027577 A1* | 1/2008 | Horak et al. | 700/121 |
| 2008/0058978 A1* | 3/2008 | Cain et al. | 700/121 |
| 2008/0086229 A1* | 4/2008 | Ueda et al. | 700/121 |
| 2008/0208383 A1* | 8/2008 | Dunham et al. | 700/121 |
| 2009/0082896 A1* | 3/2009 | Nehowig et al. | 700/117 |
| 2009/0082897 A1* | 3/2009 | Cain et al. | 700/121 |
| 2009/0157216 A1* | 6/2009 | Krishnaswamy et al. | 700/121 |
| 2009/0228131 A1* | 9/2009 | Wolk et al. | 700/103 |
| 2010/0004772 A1* | 1/2010 | Elfstrom et al. | 700/103 |

FOREIGN PATENT DOCUMENTS

| | | |
|---|---|---|
| JP | A-11-288862 | 10/1999 |
| JP | A-2002-027567 | 1/2002 |
| JP | A 2005-085784 | 3/2005 |
| JP | A-2005-093922 | 4/2005 |
| JP | A-2006-235757 | 9/2006 |
| KR | 10-0372955 | 5/2003 |

OTHER PUBLICATIONS

May 30, 2011 Office Action for Korean Application No. 10-2011-0020390 with English translation.

Korean Office Action dated Jan. 18, 2011 in corresponding Korean Patent Application No. 10-2009-0023244. (with English language translation).

Korean Office Action dated May 4, 2011 in corresponding Korean Patent Application No. 10-2011-0040492. (with English language translation).

* cited by examiner

FIG. 17

| | B | C | D | L | M | |
|---|---|---|---|---|---|---|
| 1 | | | | 950 | 952 | 954 |
| 2 | FUNCTION CATEGORY NAME (JAPANESE) | FUNCTION CATEGORY NAME (ENGLISH) | FUNCTION NAME (JAPANESE) | DEFAULT EDITING ATTRIBUTE (NON ON-LINE) | DEFAULT EDITING ATTRIBUTE (ON-LINE) | 956 |
| 10 | Edit | Edit | PROCESS RECIPE | 3 | 3 | |
| 11 | Edit | Edit | VP | 3 | 3 | |
| 12 | Edit | Edit | SUB-RECIPE | 3 | 3 | |
| 13 | Edit | Edit | ALARM RECIPE | 3 | 3 | |
| 14 | Edit | Edit | ABORT RECIPE | 3 | 3 | |
| 15 | Edit | Edit | RESET RECIPE | 3 | 3 | 958 |
| 16 | Edit | Edit | IDLE RECIPE | 3 | 3 | |
| 17 | Edit | Edit | ALARM CONDITION | 0 | 0 | |
| 18 | Edit | Edit | JUMP RULE | 3 | 3 | |
| 19 | Edit | Edit | TEMPERATURE CORRECTION | 3 | 3 | |
| 20 | Edit | Edit | TEMPERATURE PID | 3 | 3 | |
| 21 | Edit | Edit | TEMPERATURE PROFILE | 3 | 3 | |
| 22 | Edit | Edit | TEMPERATURE Y ZERO | 3 | 3 | |
| 23 | Edit | Edit | TEMPERATURE FFC | 3 | 3 | |
| 24 | Edit | Edit | TEMPERATURE SUB-HEATER | 3 | 3 | |
| 25 | Edit | Edit | TEMPERATURE ARS | 3 | 3 | |
| 26 | Edit | Edit | TEMPERATURE AUTO PID | 3 | 3 | |
| 27 | Edit | Edit | LEAK CHECK CONDITION | 3 | 3 | |
| 28 | Edit | Edit | APC PID | 3 | 3 | |
| 29 | Edit | Edit | N2 PID | 3 | 3 | |
| 30 | Edit | Edit | WAP | 3 | 3 | |
| 31 | Edit | Edit | SCHEDULED MAINTENANCE | 3 | 3 | |
| 32 | Edit | Edit | RECIPE DATA RANGE CHECK | 3 | 3 | |

FIG. 19

|  |  | FUNCTION RESTRICTION PARAMETER | | | |
|---|---|---|---|---|---|
|  |  | EDIT & READ ONLY (0×03) | EDIT (0×02) | READ ONLY (0×01) | INHIBIT (0×00) |
| USER AUTHORITY | EDIT (0×02) | EDIT | EDIT | INHIBIT | INHIBIT |
| | READ ONLY (0×01) | READ ONLY | INHIBIT | READ ONLY | INHIBIT |
| | INHIBIT (0×00) | INHIBIT | INHIBIT | INHIBIT | INHIBIT |

FIG. 20

| OPERATION ENABLED BY APPARATUS | | |
|---|---|---|
| MAIN DISPLAY CONTROLLER | SUB-DISPLAY CONTROLLER | EXTERNAL DISPLAY CONTROLLER |
| JOB COMPILATION | CARRYING IN/OUT OF CARRIER | JOB COMPILATION |
| RECIPE COMPILATION | JOB COMPILATION | RECIPE COMPILATION |
| PARAMETER COMPILATION | RECIPE COMPILATION | PARAMETER COMPILATION |
| TABLE COMPILATION | PARAMETER COMPILATION | TABLE COMPILATION |
| LOG DATA REFERENCE | TABLE COMPILATION | LOG DATA REFERENCE |
| APPARATUS CONDITION REFERENCE | LOG DATA REFERENCE | APPARATUS CONDITION REFERENCE |
| PRODUCTION INFORMATION REFERENCE | APPARATUS CONDITION REFERENCE | PRODUCTION INFORMATION REFERENCE |
| IMPEDIMENT INFORMATION REFERENCE | PRODUCTION INFORMATION REFERENCE | IMPEDIMENT INFORMATION REFERENCE |
| TRACE DATA REFERENCE | IMPEDIMENT INFORMATION REFERENCE | TRACE DATA REFERENCE |
| FILE MAINTENANCE | TRACE DATA REFERENCE | |
| REMOTE COMMAND | FILE MAINTENANCE | |
| | REMOTE COMMAND | |

SUBSTRATE PROCESSING APPARATUS AND SUBSTRATE PROCESSING SYSTEM

BACKGROUND OF THE INVENTION

1. Technical Field

The present invention relates to a substrate processing system and a substrate processing apparatus which process a substrate such as a semiconductor wafer or a glass substrate.

2. Related Art

A technology is known which is a remote operating system of a semiconductor manufacturing apparatus, which enables an access to a management apparatus of the semiconductor manufacturing apparatus, via a line, from a remote operating apparatus, wherein the remote operating apparatus enables a displaying of a screen identical to a screen displayed on the management apparatus, and a carrying out of an operation, identical to an operation of the management apparatus, on the semiconductor manufacturing apparatus (JP-A-2002-27567).

However, in the heretofore known technology, there has been a problem in that it is impossible to cause each display portion to output a different display, and to carry out a different operation.

SUMMARY OF THE INVENTION

The invention has an object of providing a substrate processing system which can cause each display portion to output a different display, and to carry out a different operation, and can cause functions displayed on a screen to differ from user to user based on information when a user logs in, and impose restrictions on the operations.

The invention is directed to a substrate processing apparatus including: a substrate processing mechanism which processes a substrate; a controller which controls at least the substrate processing mechanism; a first display portion which, as well as being connected to the controller, is fixed to the substrate processing mechanism, and on which is displayed a first operation screen for operating at least the substrate processing mechanism; and a second display portion which, as well as being connected to the controller, is disposed in a vicinity of the substrate processing mechanism, and on which is displayed a second operation screen for operating at least the substrate processing mechanism, wherein the controller can cause each of the first display portion and second display portion to output a different display, and carries out a different operation by means of each of an instruction from the first display portion and an instruction from the second display portion.

According to the invention, different displays and different operations are possible among an external operating portion connected to a main operating portion of the substrate processing apparatus, an external substrate connected to the vicinity of the substrate processing apparatus, and an external operating portion disposed in a position separated from the substrate processing apparatus. Therefore, it becomes possible to carry out various operations which a user desires, and thus an operability is improved. Also, as it is possible to control in such a way that it is impossible to execute a kind of operation (an editing of a recipe such as a process recipe, a setting of an alarm or the like, or the like), which operationally impedes a production, from the external operating portion, a safety is improved. On the other hand, as it is possible to carry out a kind of operation, which does not operationally impede the production, from an external operating portion in a client's office too, a convenience is also improved. Therefore, it becomes possible to save a trouble of changing into a clean room suit to operate the operating portion of the substrate processing apparatus in a clean room.

BRIEF DESCRIPTION OF THE DRAWINGS

FIG. 17 is a view illustrating a function restriction setting screen displayed on an external display device of the substrate processing apparatus according to the embodiment of the invention;

FIG. 19 is a diagram showing a logical product of an authority parameter value and a function restriction parameter value, in the substrate processing apparatus according to the embodiment of the invention; and FIG. 20 is a diagram showing an operation which can be carried out by each operating apparatus of the substrate processing apparatus according to the embodiment of the invention.

DESCRIPTION OF THE PREFERRED EMBODIMENT(S)

Next, a description will be given, based on the drawings, of a preferred embodiment for carrying out the invention.

Figure 1:
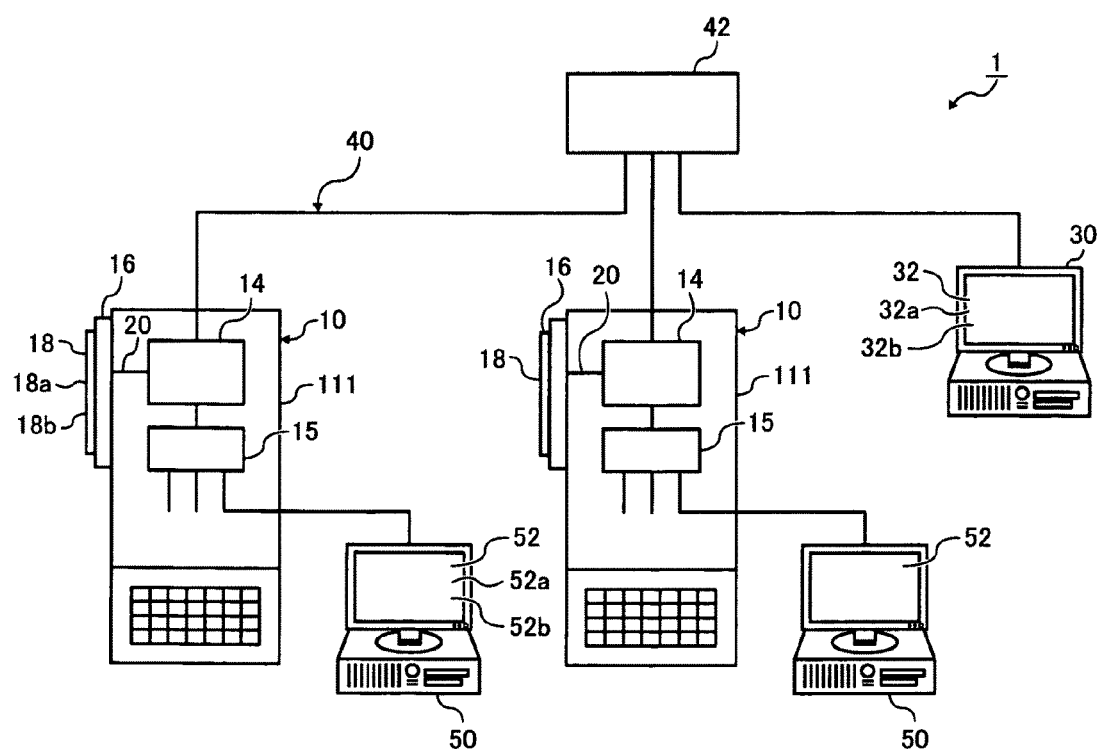
FIG. 1 is a diagram showing an outline configuration of a substrate processing system including a substrate processing apparatus according to an embodiment of the invention.

FIG. 1 is a diagram showing a configuration of a substrate processing system 1 according to the embodiment of the invention. As shown in FIG. 1, the substrate processing system 1 has a substrate processing apparatus 10, and an external operating apparatus 30 used as a second operating apparatus, and these apparatus are, for example, mutually connected by a communication network 40, such as a LAN, which has a switching hub 42.

The substrate processing apparatus 10, being used as the substrate processing apparatus according to the embodiment of the invention, is configured as, for example, a semiconductor manufacturing apparatus which implements a semiconductor device (IC) manufacturing method. In the following description, a description will be given of a case in which the invention is applied, as the substrate processing apparatus, to a vertical type apparatus which carries out an oxidation diffusion process, a CVD process or the like on a substrate.

It is also acceptable that a plurality, for example, two, as shown in FIG. 1, of the substrate processing apparatus 10 are provided in the substrate processing system 1, and it is also acceptable that one substrate processing apparatus 10 is provided in the substrate processing system 1.

Each of the substrate processing apparatus 10 used as a substrate processing mechanism (unit) which processes a substrate has a substrate processing apparatus main body 111, and a processing furnace 202 (not shown in FIG. 1, refer to FIG. 2) used as a processor which processes a substrate, a main controller 14, and a switching hub 15 are provided in the substrate processing apparatus main body 111. Also, a main operating apparatus 16 used as a first operating apparatus is attached to an outer wall of the substrate processing main body 111, for example, on a back surface side (a left side in FIG. 1) of the substrate processing apparatus 10. Also, a sub-operating apparatus 50 used as a third operating apparatus is connected to the substrate processing apparatus 10 in such a way as to be connected to the main controller 14 via the switching hub 15.

The main operating apparatus 16 is disposed in a vicinity of the substrate processing apparatus 10 (or the processing furnace 202 and substrate processing apparatus main body 111). The main operating apparatus 16 is integrally fixed to the substrate processing apparatus 10 in such a way as to be attached to the substrate processing apparatus main body 111, as in the embodiment.

Herein, the main operating apparatus 16 being disposed in the vicinity of the substrate processing apparatus 10 (or the processing furnace 202 and substrate processing apparatus main body 111) refers to the fact that the main operating apparatus 16 is disposed in a position in which an operator can confirm a condition of the substrate processing apparatus 10.

The main operating apparatus 16 is installed in, for example, a clean room in which the substrate processing apparatus main body 111 is installed.

The main operating apparatus 16 has a main display device 18 used as a first display portion.

The main display device 18 is formed of, for example, a liquid crystal display panel. Also, a main operation screen 18*a* used as a first operation screen for operating at least the substrate processing apparatus 10 is displayed on the main display device 18. Also, a main parameter setting screen 18*b* used as a parameter setting screen for setting various parameters relating to the substrate processing apparatus 10 is displayed on the main display device 18.

Herein, the various parameters relating to the substrate processing apparatus 10 are of great variety. For example, in the invention, the parameters include at least a group parameter which sets a group to which a user (the operator) who operates at least the substrate processing apparatus 10 belongs, an authority parameter which regulates an operational authority set in advance corresponding to the group to which the user belongs, a function restriction parameter which restricts functions which the user operates, and the like. Another examples of the parameter include a parameter (a user parameter) with user information (a user ID and a password) listed for each user can also be included.

Details of the main operation screen 18*a* and main parameter setting screen 18*b* will be described hereafter.

The sub-operating apparatus 50 has a sub-display device 52 used as a third display portion.

The sub-display device 52 is formed of, for example, a liquid crystal display panel. A sub-operation screen 52*a* used as a third operation screen for operating at least the substrate processing apparatus 10 is displayed on the sub-display device 52. Also, a sub-setting screen 52*b* used as the parameter setting screen for setting the various parameters relating to the substrate processing apparatus 10 is displayed on the sub-display device 52.

The sub-operating apparatus 50 is formed of, for example, a WBT (Windows Based Terminal). Herein, the WBT, being a dedicated terminal which, being connected via a network or the like to a server for which a WTS (Windows Terminal Server), which is a Microsoft OS, is operating, carries out a process, is configured in such a way as to be able to carry out a minimum process for an input and output.

Also, the sub-operating apparatus 50 is disposed in a vicinity of the substrate processing apparatus 10 (or the processing furnace 202 and substrate processing apparatus main body 111). The sub-operating apparatus 50 is fixed to the substrate processing apparatus main body 111. Herein, the sub-operating apparatus 50 being disposed in the vicinity of the substrate processing apparatus 10 (or the processing furnace 202 and substrate processing apparatus main body 111) refers to the fact that the sub-operating apparatus 50 is disposed in a position in which the operator can confirm the condition of the substrate processing apparatus 10. In the same way as in the case of the main operating apparatus 16, the sub-operating apparatus 50 is installed in, for example, the clean room in which the substrate processing apparatus main body 111 is installed. However, the sub-operating apparatus 50, not necessarily being disposed on the same side as the main operating apparatus 16, is disposed in a position which, being in a vicinity of the substrate processing apparatus main body 111, is out of sight from the main operating apparatus 16. The main operating apparatus 16 is installed on a front surface of the substrate processing apparatus main body 111, and the sub-operating apparatus 50 is disposed to a rear of the substrate processing apparatus main body 111.

The external operating apparatus 30 has an external display device 32 used as a second display portion.

The external display device 32 is formed of, for example, a liquid crystal display panel. Also, an external operation screen 32a used as a second operation screen for operating at least the processor 202 is displayed on the external display device 32. Furthermore, it is acceptable that an external parameter setting screen 32b used as the parameter setting screen for setting the various parameters relating to the substrate processing apparatus 10 is displayed on the external display device 32 also.

Also, the external operating apparatus 30, being formed of a WBT (Windows Based Terminal), in the same way as the sub-operating apparatus 50, can be connected to the main controller 14 via the communication network 40, in the way previously described. For this reason, the external operating apparatus 30 can be disposed in a position separated from the substrate processing apparatus 10. Therefore, even in the event that the substrate processing apparatus 10 is installed in the clean room, for example, the external operating apparatus 30 can be disposed in an office or the like outside the clean room.

The main controller 14 is used as a controller which controls at least the processing furnace 202. A control of the substrate processing system 1 is carried out by the main controller 14. Also, the main controller 14 has a memory which stores various parameters, such as the group parameter which sets the group to which the user (operator) who operates at least the substrate processing apparatus 10 belongs, the authority parameter which regulates the operational authority set corresponding to the group to which the user belongs, and the restriction parameter which restricts the functions which the user operates, and various recipes, such as a process recipe for subjecting a substrate to a predetermined process.

The main controller 14 is connected to the main operating apparatus 16 using, for example, a video cable 20. Instead of the main controller 14 and main operating apparatus 16 being connected using the video cable 20, it is also acceptable that the main controller 14 and main operating apparatus 16 are connected via the communication network 40.

Also, for example, the previously described WTS is installed on the main controller 14.

The WTS has a multiuser function added to a Windows NT Server which is a Microsoft OS. The WTS can connect a plurality of terminals at the same time to one server through a network, it is possible to carry out a process from the plurality of terminals. At this time, a processing of all application software is executed in the server, and a screen is forwarded to a terminal side.

The main controller 14 can cause each of the main display device 18, external display device 32, and sub-display device 52 to output a different display. That is, the main controller 14 can cause the main operation screen 18a, external operation screen 32a, and sub-operation screen 52a to be displayed differently from one another.

Also, the main controller 14 can carry out a different control to the main display device 18, external display device 32, and sub-operating apparatus 50. That is, the main controller 14 can carry out a different instruction in response to each of operations from the main operation screen 18a, external operation screen 32a, and sub-operation screen 52a.

More specifically, by logging into the main controller 14 from the main operating apparatus 16, sub-operating apparatus 50, and external operating apparatus 30, it is possible to start a plurality of identical programs by means of the main controller 14. As a result, a different operation screen is displayed on each of the main display device 18, sub-display device 52, and external display-device 32, and it is possible to carry out a different instruction from each of the main display device 18, sub-display device 52, and external display device 32.

Figure 2:
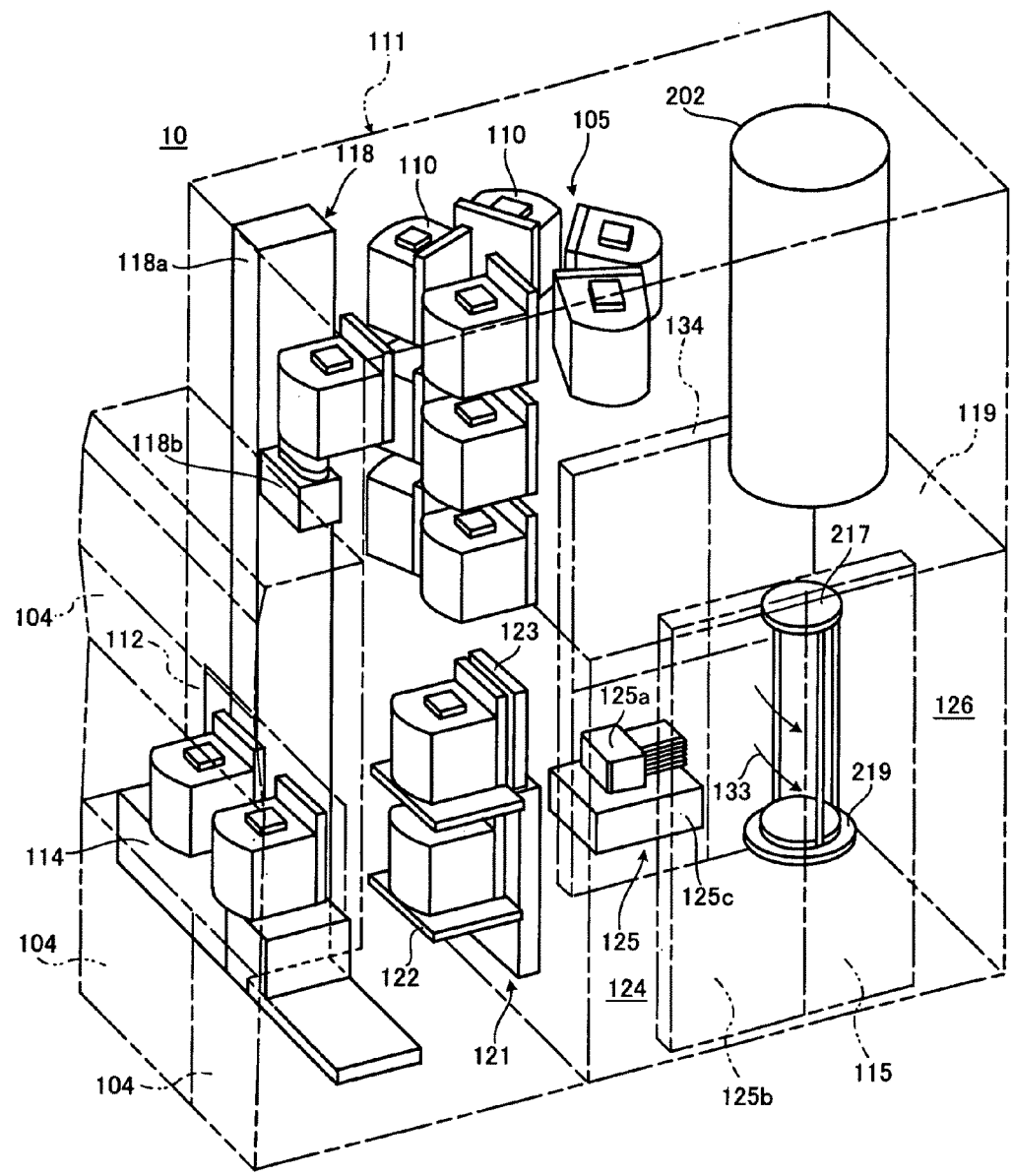
FIG. 2 is a perspective view showing the substrate processing apparatus according to the embodiment of the invention.

In FIG. 2, the substrate processing apparatus 10 is shown using a perspective view. Also, in FIG. 3, the substrate processing apparatus 10 is shown using a side transparent view.

The substrate processing apparatus 10 processes a wafer 200 which, being made of silicon or the like, is used as a substrate.

Figure 3:
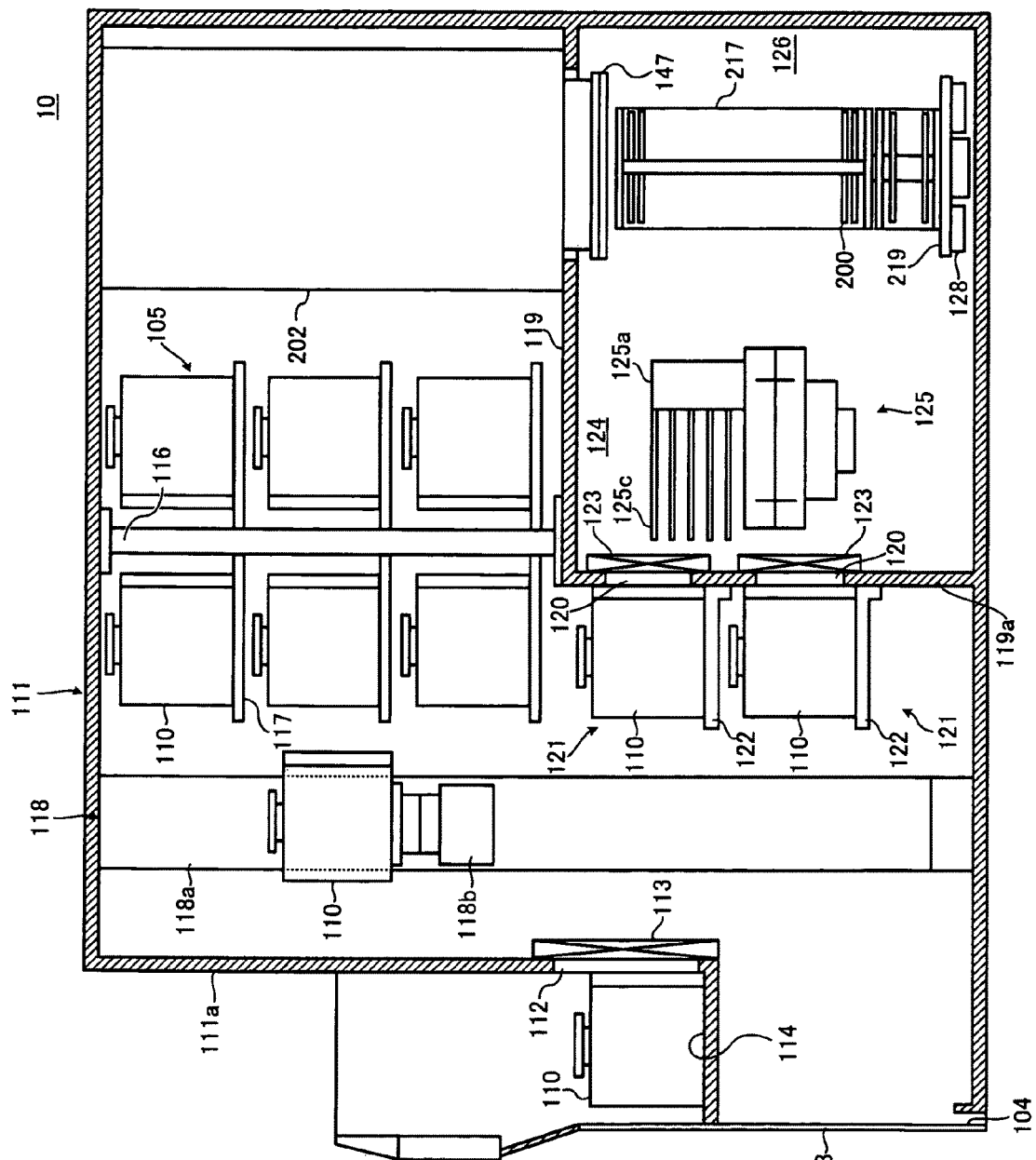
FIG. 3 is a sectional view showing a left side surface side section of the substrate processing apparatus shown in FIG. 2.

As shown in FIGS. 2 and 3, a FOUP (a substrate container, hereafter referred to as a pod) 110 which, being used as a wafer carrier, contains the wafer 200 is used in the substrate processing apparatus 10. Also, the substrate processing apparatus 10 includes the substrate processing apparatus main body 111.

A front maintenance opening 103 used as an opening provided in such a way as to enable maintenance, being opened in an anterior frontal portion of a front wall 111a of the substrate processing apparatus main body 111, is furnished with a front maintenance door 104 which opens and closes the front maintenance opening 103. Although not shown, the sub-operating apparatus 50 is installed in a vicinity of the upper front maintenance door 104. The main operating apparatus 16 is installed in a vicinity of a maintenance door in the rear side.

A pod carrying in/out opening (a substrate container carrying in/out opening) 112 is opened in the front wall 111a of the substrate processing apparatus 111 in such a way as to provide communication between an interior and exterior of the substrate processing apparatus main body 111, and the pod carrying in/out opening 112 is opened and closed by a front shutter (a substrate container carrying in/out opening opening/closing mechanism) 113.

A loading port (a substrate container delivery platform) 114 is installed on an anterior frontal side of the pod carrying in/out opening 112, and the loading port 114 is configured in such a way that the pod 110 is mounted thereon and positioned. The pod 110 is carried onto the loading port 114, and carried off the loading port 114, by an in-process conveyance apparatus (not shown).

A rotatable pod shelf (a substrate container mounting shelf) 105 is installed in an upper portion, approximately central in a front-rear direction, inside the substrate processing apparatus main body 111, and the rotatable pod shelf 105 is configured in such a way as to store a plurality of the pods 110. That is, the rotatable pod shelf 105 includes a column 116 which, being provided standing vertically, is intermittently rotated in a horizontal plane, and a plurality of shelf plates (substrate container mounting racks) 117 supported on the column 116 in a radial fashion in each of top, middle and bottom positions, and the plurality of shelf plates 117 are configured in such a way as to hold the pods 110 in a condition in which the plurality of pods 110 are mounted one on each of the plurality of shelf plates 117.

A pod conveyance apparatus (a substrate container conveyance apparatus) 118 being installed in a space between the loading port 114 and the rotatable pod shelf 105 in the substrate processing apparatus main body 111, the pod conveyance apparatus 118 is configured of a pod elevator (a substrate container lifting/lowering mechanism) 118a, which can lift and lower the pod 110 while holding it, and a pod conveyance mechanism (a substrate container conveyance mechanism) 118b acting as a conveyance mechanism, and the pod conveyance mechanism 118 is configured in such a way as to convey the pod 110 between the loading port 114, the rotatable pod shelf 105, and a pod opener (a substrate container covering opening/closing mechanism) 121 by means of a series of operations of the pod elevator 118a and pod conveyance mechanism 118b.

A sub-housing 119 is constructed, all the way to a rear end, in a lower portion, approximately central in the front-rear direction, inside the substrate processing apparatus main body 111. A pair of wafer carrying in/out openings (substrate carrying in/out openings) 120 for carrying the wafer 200 into, and out of, the sub housing 119 are opened in a front wall 119a of the sub-housing 119 in such a way as to be disposed in two levels, one above the other, in a vertical direction, and a pair of the pod openers 121 and 121 are installed on the upper and lower wafer carrying in/out openings 120 and 120, respectively. The pod openers 121 and 121 include mounting platforms 122 and 122, which mount the pods 110 and 110, and cap attaching/removing mechanisms (covering attaching/removing mechanisms) 123 and 123, which attach and remove caps (coverings) of the pods 110 and 110, respectively. Each of the pod openers 121 and 121 is configured in such a way that a wafer inserting/removing opening of the pod 110 is opened and closed by removing and attaching the cap of the pod 110 mounted on the mounting platform 122 by means of the cap attaching/removing mechanism 123.

The sub-housing 119 configures a transfer chamber 124 fluidically isolated from a space in which are installed the pod conveyance apparatus 118 and rotatable pod shelf 105. A wafer transfer mechanism (a substrate transfer mechanism) 125 is installed in a front side region of the transfer chamber 124, and the wafer transfer mechanism 125 is configured of a wafer transfer apparatus (a substrate transfer apparatus) 125a, which can rotate or translate the wafer 200 in a horizontal direction, and a wafer transfer apparatus elevator (a substrate transfer apparatus lifting/lowering mechanism) 125b, which lifts and lowers the wafer transfer apparatus 125a. As schematically shown in FIG. 2, the wafer transfer apparatus elevator 125b is installed between a right side end of the pressure-proof substrate processing apparatus main body 111 and an anterior region right end of the transfer chamber 124 of the sub-housing 119. The wafer transfer mechanism 125 is configured in such a way as to load and discharge the wafer 200 into and from a boat (a substrate retainer) 217, with tweezers (a substrate holder) 125c of the wafer transfer apparatus 125a as a wafer 200 mounting portion, by means of a series of operations of the wafer transfer elevator 125b and wafer transfer apparatus 125a.

A standby portion 126 which holds the boat 217 in a standby condition is configured in a rear side region of the transfer chamber 124. The processing furnace 202 is provided above the standby portion 126. A lower end of the processing furnace 202 is configured in such a way as to be opened and closed by a furnace opening shutter (a furnace opening opening/closing mechanism) 147.

As schematically shown in FIG. 2, a boat elevator (a substrate retainer lifting/lowering mechanism) 115 for lifting and lowering the boat 217 is installed between a right side end of the pressure-proof substrate processing apparatus main body 111 and a right end of the standby portion 126 of the sub-housing 119. A sealing cap 219 acting as a covering is horizontally fixed to an arm 128 acting as a connector connected to a lifting/lowering platform of the boat elevator 115, and the sealing cap 219, supporting the boat 217 vertically, is configured in such a way as to be able to close the lower end of the processing furnace 202.

The boat 217 includes a plurality of holding members, and the holding members are configured in such a way as to hold a plurality (for example, around 50 to 125) of the wafers 200 horizontally in a condition in which the wafers 200 are ordered in a vertical direction with their centers aligned.

Also, as schematically shown in FIG. 2, a cleaning unit 134 configured of a supply fan and an anti-dust filter is installed at a left side end, opposite a wafer transfer apparatus elevator 125b side and boat elevator 115 side of the transfer chamber 124, in such a way as to supply a clean air 133 which is a cleaned atmosphere or an inert gas and, although not shown, a notch alignment apparatus acting as a substrate alignment apparatus which aligns circumferential positions of wafers is installed between the wafer transfer apparatus 125a and the cleaning unit 134.

A configuration is such that the clean air 133 blown from the cleaning unit 134, after being circulated into the notch alignment apparatus, the wafer transfer apparatus 125a, and the boat 217 in the standby portion 126, is sucked in by an unshown duct, and discharged to the exterior of the substrate processing apparatus main body 111, or it is circulated to a primary side (a supply side) which is a suction side of the cleaning unit 134, and blown into the transfer chamber 124 again by the cleaning unit 134.

Next, a description will be given of operations of the substrate processing apparatus 10 of the invention.

As shown in FIGS. 2 and 3, on the pod 110 being supplied to the loading port 114, the pod carrying in/out opening 112 is opened by the front shutter 113, and the pod 110 on the loading port 114 is carried into the interior of the substrate processing apparatus main body 111 through the pod carrying in/out opening 112 by the pod conveyance apparatus 118.

The pod 110 carried in is automatically conveyed and delivered to a specified shelf plate 117 of the rotatable pod shelf 105 by the pod conveyance apparatus 118, conveyed and delivered to one pod opener 121 from the shelf plate 117 after being temporarily stored, and conveyed from the shelf plate 117 to one pod opener 121 and transferred to the mounting platform 122, or directly conveyed to the pod opener 121 and transferred to the mounting platform 122, after being temporarily stored. At this time, the wafer carrying in/out opening 120 of the pod opener 121 is closed by the cap attaching/removing mechanism 123, and the clean air 133 is circulated into, and fills, the transfer chamber 124. For example, by the transfer chamber 124 being filled with a nitrogen gas as the clean air 133, an oxygen level is set at 20 ppm or less, far lower than an oxygen level of the interior (atmosphere) of the substrate processing apparatus main body 111.

As well as an opening side end face of the pod 110 mounted on the mounting platform 122 being pressed against an opening edge of the wafer carrying in/out opening 120 in the front wall 119a of the sub-housing 119, the cap thereof is removed by the cap attaching/removing mechanism 123, opening the wafer inserting/removing opening.

On the pod 110 being opened by the pod opener 121, the wafer 200 is picked up from the pod 110 through the wafer inserting/removing opening by the tweezers 125c of the wafer transfer apparatus 125a, carried into the standby portion 126 posterior to the transfer chamber 124 after being aligned in the unshown notch alignment apparatus 135, and loaded into the boat 217. The wafer transfer apparatus 125a which has delivered the wafer 200 to the boat 217 returns to the pod 110, and loads a next wafer into the boat 217.

During the operation of loading the wafer into the boat 217 by means of the wafer transfer mechanism 125 in the one (upper or lower) pod opener 121, another pod 110 being conveyed and transferred to the other (lower or upper.) pod opener 121 from the rotatable pod shelf 105 by the pod conveyance apparatus 118, the operation of opening the pod 110 by means of the pod opener 121 is carried out at the same time.

On a number of wafers 200 specified in advance being loaded into the boat 217, the lower end of the processing furnace 202 closed by the furnace opening shutter 147 is opened by the furnace opening shutter 147. Continuingly, the boat 217 holding a group of the wafers 200, by the sealing cap 219 being lifted by the boat elevator 115, is carried (loaded) into the processing furnace 202.

After the loading, an optional process is executed on the wafers 200 in the processing furnace 202.

After the process, the wafers 200 and pod 110 are discharged to an exterior of the housing according to a procedure, a reversal of the heretofore described one, except for a wafer alignment step in the unshown notch alignment apparatus 135.

Next, a description will be given of a hardware configuration centered on the main controller 14 in the substrate processing system 1.

Figure 4:
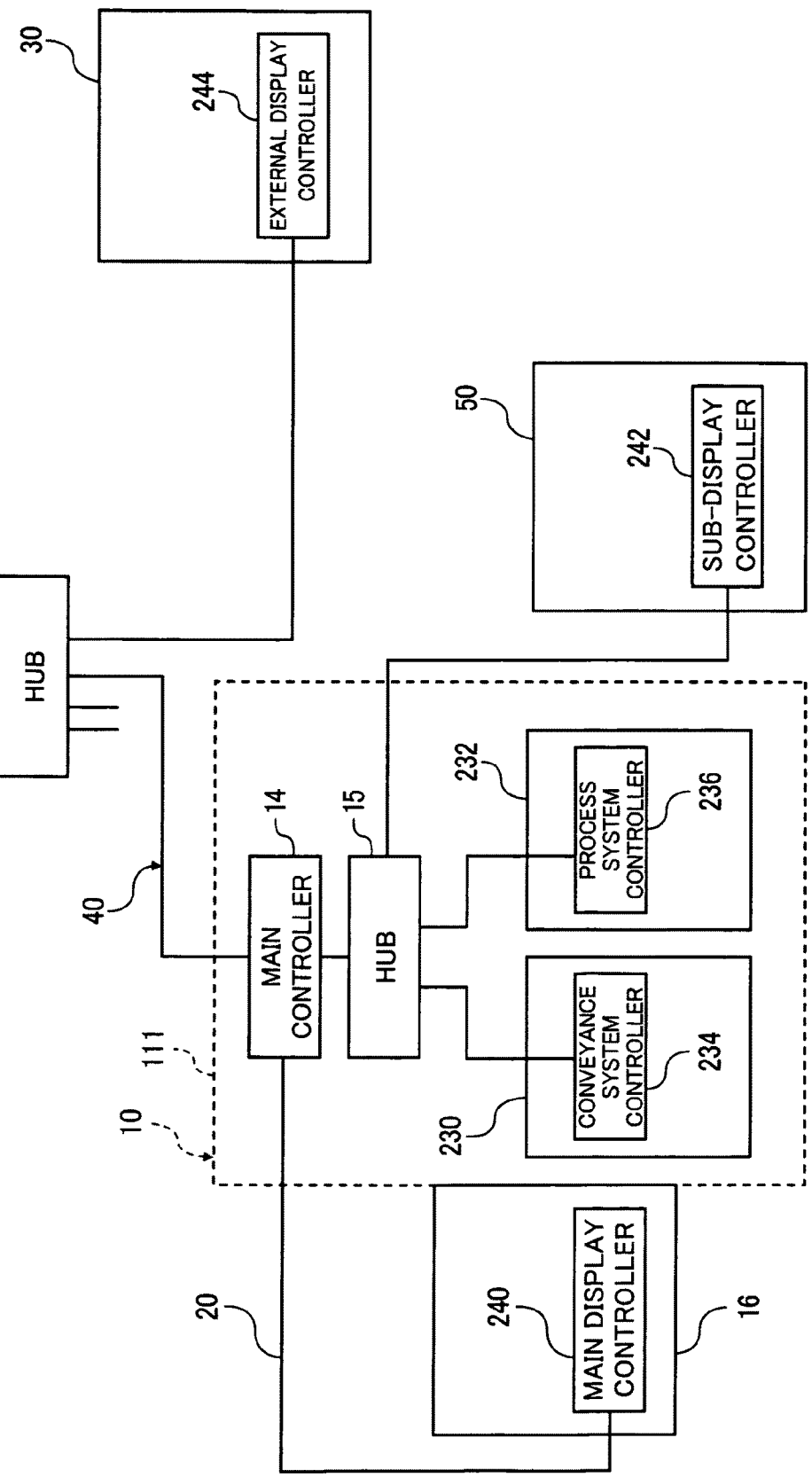
FIG. 4 is a block diagram showing one example of a configuration centered on a controller of the substrate processing apparatus according to the embodiment of the invention.

FIG. 4 shows a schematic hardware configuration centered on the main controller 14 of the substrate processing system 1.

As shown in FIG. 4, a conveyance controller 230 and a process controller 232, together with the previously described main controller 14 and switching hub 15, are provided in the substrate processing apparatus main body 111 of the substrate processing apparatus 10. It is also acceptable that the conveyance controller 230 and process controller 232 are provided outside the substrate processing apparatus main body 111 instead of inside the substrate processing apparatus main body 111.

The conveyance controller 230 has a conveyance system controller 234 formed of, for example, a CPU or the like, and the process controller 232 has a process system controller 236 formed of, for example, a CPU or the like. The conveyance system controller 234 and process system controller 236 are each connected to the main controller 14 via the switching hub 15. Details of the conveyance controller 230 and process controller 232 will be described hereafter.

Also, as shown in FIG. 4, a main display controller 240 used, for example, to control the display of the main display device 18 (refer to FIG. 1) is provided in the main operating apparatus 16. The main display controller 240 is connected to the main controller 14 using, for example, the video cable 20. Details of the main display controller 240 will be described hereafter.

Also, as shown in FIG. 4, a sub-display controller 242 used, for example, to control the display of the sub-display device 52 (refer to FIG. 1) is provided in the sub-operating apparatus 50. The sub-display controller 242 is connected to the main controller 14 via the switching hub 15. Details of the sub-display controller 242 will be described hereafter.

Also, as shown in FIG. 4, an external display controller 244 used, for example, to control the display of the external display device 32 is provided in the external operating apparatus 30. The external display controller 244 is connected to the main controller 14 via the communication network 40 having the switching hub 42. Details of the external display controller 244 will be described hereafter.

Figure 5:
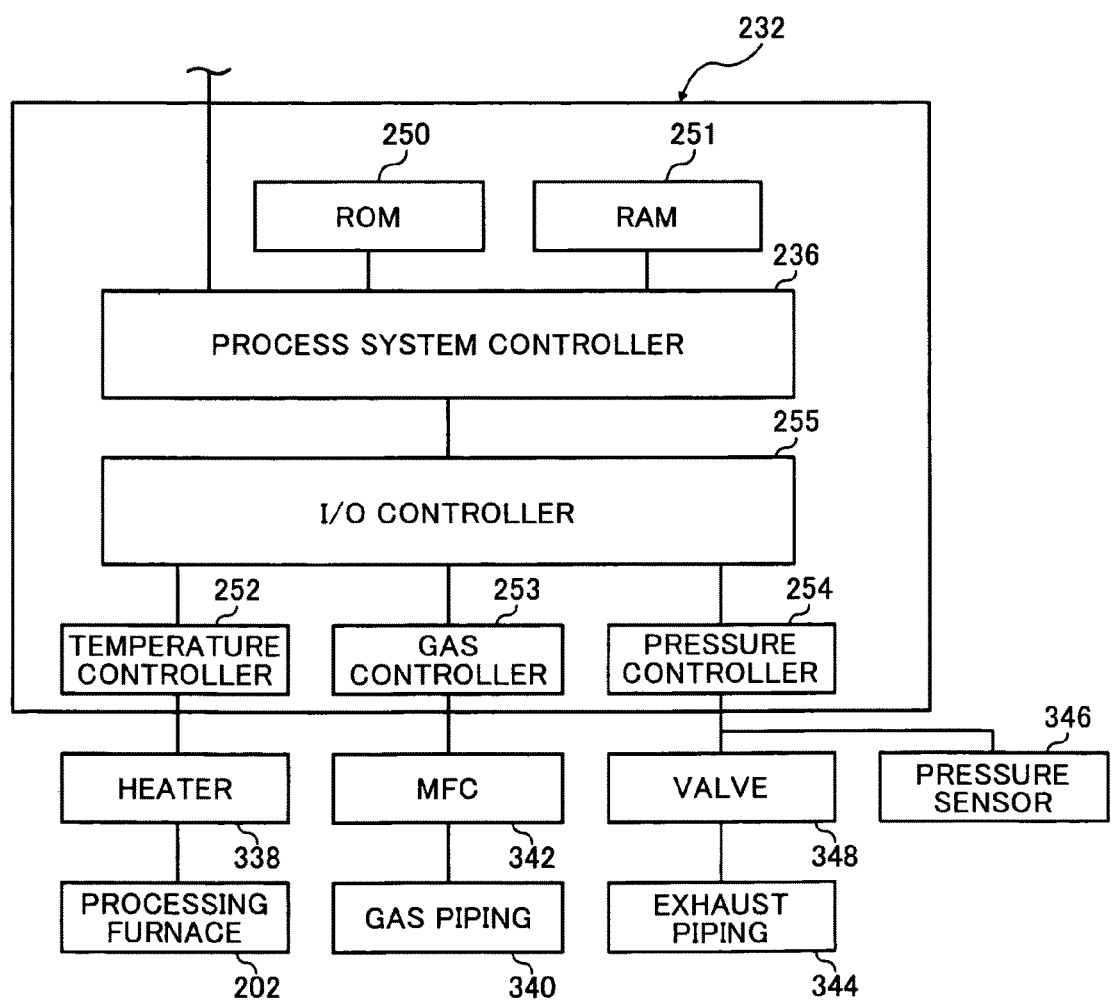
FIG. 5 is a block diagram showing one example of a configuration of a process controller of the substrate processing apparatus according to the embodiment of the invention.

The details of the process controller 232 are illustrated in FIG. 5.

As shown in FIG. 5, the process controller 232, as well as having the previously described process system controller 236, has an ROM (read-only memory) 250, an RAM (random-access memory) 251, a temperature controller 252, a gas controller 253, a pressure controller 254, and an I/O controller 255 which carries out a control of an input/output with respect to the temperature controller 252 or the like.

The process system controller 236, based on, for example, a recipe which is compiled or edited on the main operation screen 18a in main operating apparatus 16, and stored in the RAM 251 or the like, transmits control data (a control instruction) for processing a substrate to the temperature controller 252, gas controller 253, and pressure controller 254.

A sequence program, a plurality of recipes, input data (an input instruction) input from the main operating apparatus 16 or the like, a recipe command, history data when recipe is executed, and the like are stored in the ROM 250 or RAM 251. It is also acceptable that a storage device (not shown) realized by a hard disc drive (HDD) or the like is included in the process controller 232, in which case the same data as the data stored in the RAM 251 are stored in the storage device. In this way, the ROM 250 or RAM 251 is used as a memory which stores various recipes in which are described procedures of processing a substrate.

An input instruction is issued from the main operation screen 18a displayed on the main display device 18 of the main operating apparatus 16, from the sub-operation screen 52a displayed on the sub-display device 52 of the sub-operating apparatus 50, or from the external operation screen 32a displayed on the external display device 32 of the external operating apparatus 30. Also, one example of the input instruction includes, an instruction to execute a recipe, an instruction to set each user's operational authority, or the like, but is not limited to this.

The temperature controller 252 controls a temperature in the processing furnace 202 by controlling the power of a heater 338 provided on an outer periphery of the processing furnace 202. The gas controller 253, based on an output value from an MFC (mass flow controller) 342 provided in a gas piping 340 of the processing furnace 202, controls an amount of a reactive gas supplied to an interior of the processing furnace 202. The pressure controller 254, based on an output value of a pressure sensor 346 provided in an exhaust piping 344 of the processing furnace 202, controls a pressure in the processing furnace 202 by opening and closing a valve 348.

In this way, sub-controllers such as the temperature controller 252, based on the control instruction from the process system controller 236, carry out a control of each portion (the heater 338, MFC 342, valve 348, and the like) of the substrate processing apparatus 10.

Figure 6:
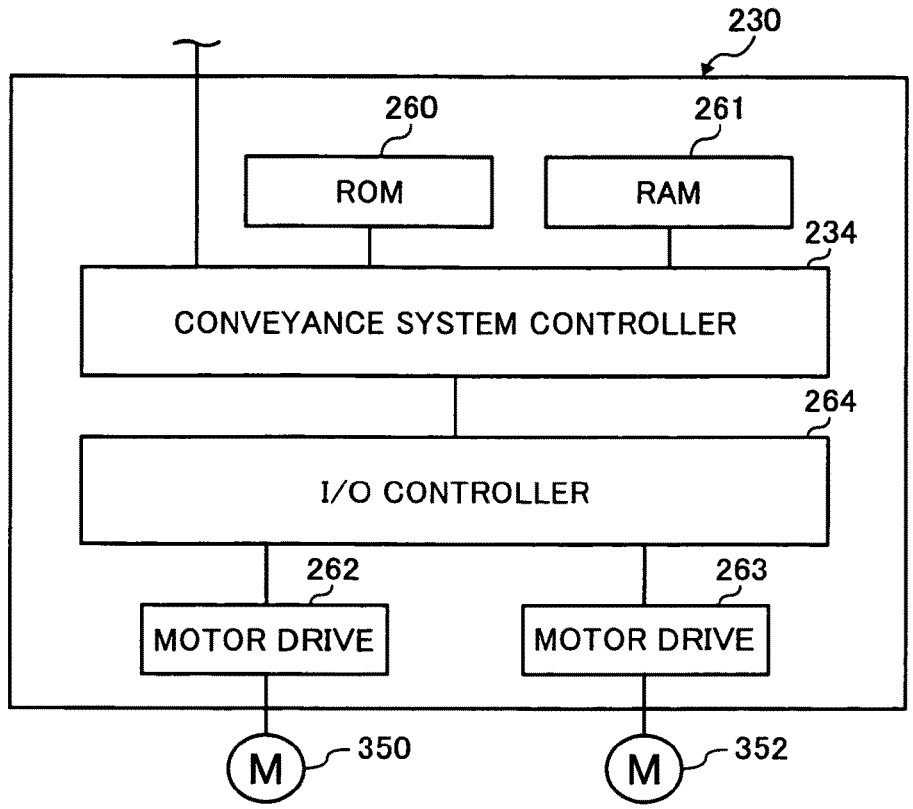
FIG. 6 is a block diagram showing one example of a configuration of a conveyance controller of the substrate processing apparatus according to the embodiment of the invention.

The details of the conveyance controller 230 are illustrated in FIG. 6.

As shown in FIG. 6, the conveyance controller 230, as well as having the previously described conveyance system controller 234, has an ROM (read-only memory) 260, an RAM (random-access memory) 261, a motor drive 262, a motor drive 263, and an I/O controller 264 which carries out a control of an input/output with respect to the motor drive 262 or the like.

The conveyance system controller 234, for example, based on a recipe which is compiled or edited on the main operation screen 18a in main operating apparatus 16, and stored in the RAM 261 or the like, transmits control data (a control instruction) for conveying a substrate to the motor drive 262 and motor drive 263.

The motor drive 262 and motor drive 263 control a conveyance of the wafer 200 in the substrate processing system 1 by a motor 350 and a motor 352 which are used as drive sources for conveying a substrate.

Figure 7:
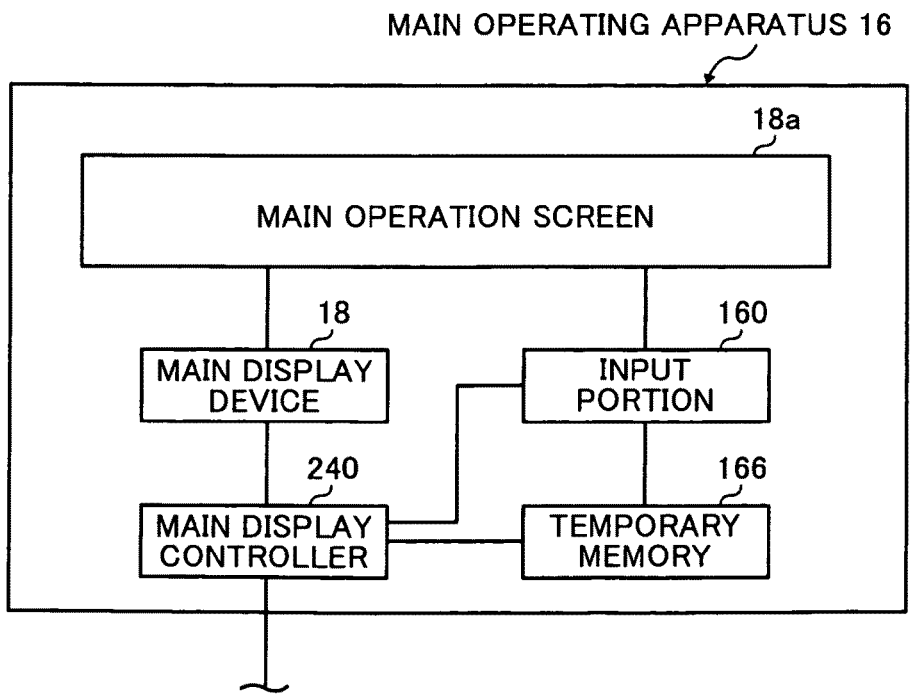
FIG. 7 is a block diagram showing one example of a configuration of a main operating apparatus of the substrate processing apparatus according to the embodiment of the invention.

The details of the main operating apparatus 16 are shown in FIG. 7.

As shown in FIG. 7, the main operating apparatus 16 has the previously described main display device 18, the main display controller 240, an input portion 160 which receives user's (operator's) input data from the main operation screen 18a displayed on the main display device 18, and a temporary memory 166 which stores the input data received by the input portion 160 until the main display controller 240 transmits them to the main controller 14.

The main display controller 240 receives the input data (an input instruction) from the input portion 160, and transmits the relevant input data to the main display device 18 or main controller 14.

Also, the main display controller 240 receives an instruction (a control instruction) to cause the process system controller 236 to execute an optional recipe among the plurality of recipes stored in the ROM 250 or RAM 251. Also, the main display device 18 displays the optional recipe indicated by the instruction from the main display controller 240 as the main operation screen 18a, and displays it as the main parameter setting screen 18b for carrying out a setting of a parameter such as a user's (operator's) operational authority.

Figure 8:
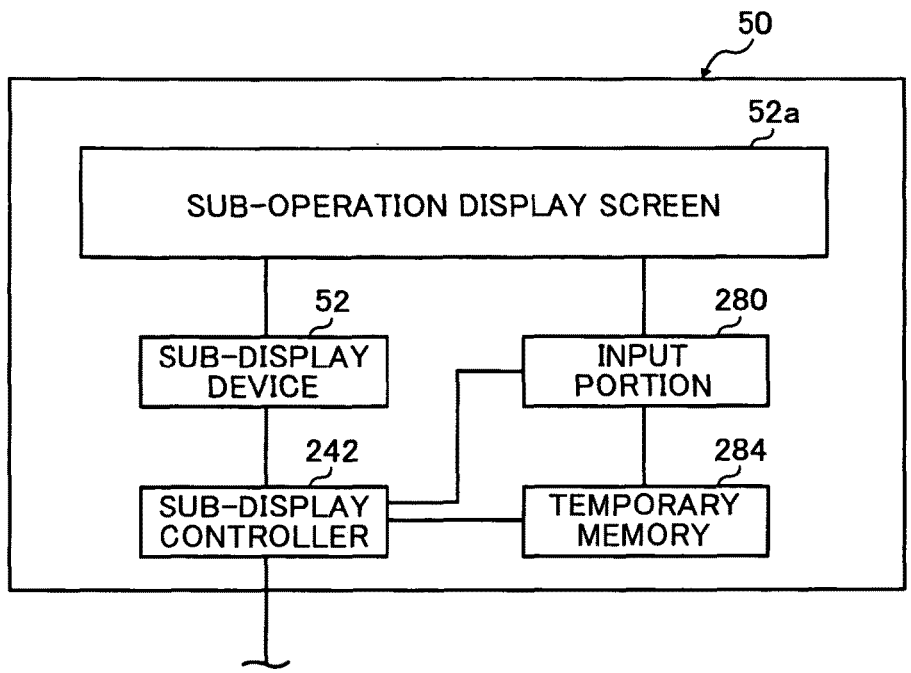
FIG. 8 is a block diagram showing one example of a configuration of a sub-operating apparatus of the substrate processing apparatus according to the embodiment of the invention.

The details of the sub-operating apparatus 50 are shown in FIG. 8.

As shown in FIG. 8, the sub-operating apparatus 50 has the previously described sub-display device 52, the sub-display controller 242, an input portion 280 which receives user's (operator's) input data (an input instruction) from the sub-operation screen 52a displayed on the sub-display device 52, and a temporary memory 284 which stores the input data received by the input portion 280 until the main display controller 240 transmits them to the main controller 14.

The sub-display controller 242 receives the input data (input instruction) from the input portion 280, and transmits the relevant input data to the sub-display device 52 or main controller 14.

Also, the sub-display controller 242 receives an instruction (a control instruction) to cause the process system controller 236 to execute an optional recipe, among the plurality of recipes stored in the ROM 250 or RAM 251. Also, the sub-display device 52 displays the optional recipe indicated by the instruction from the sub-display controller 242 on the sub-operation screen 52a, and displays various screens, such as the sub-parameter setting screen 52b for carrying out a setting of a parameter such as a user's (operator's) operational authority.

Figure 9:
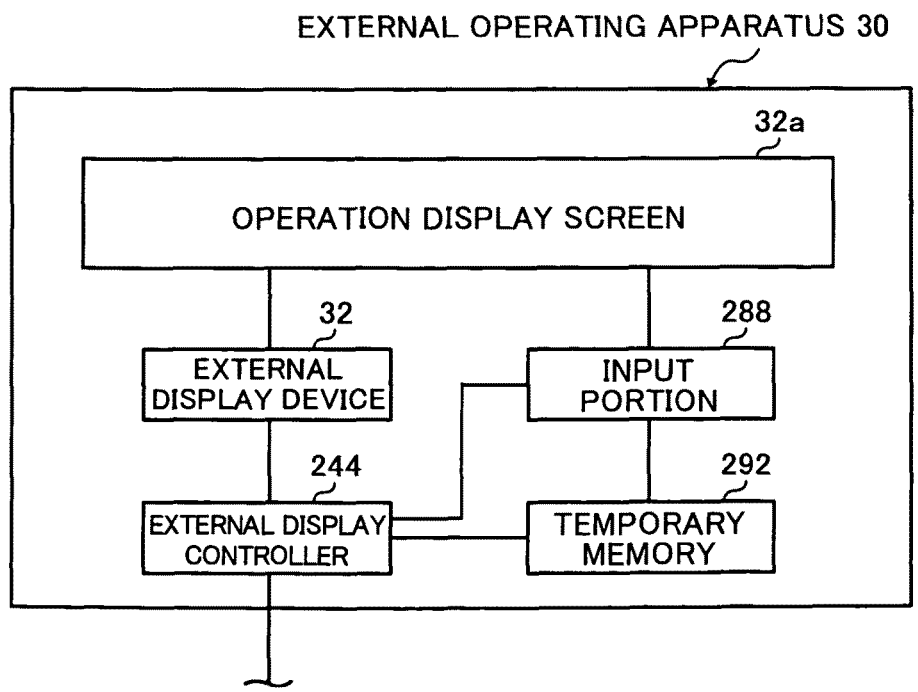
FIG. 9 is a block diagram showing one example of a configuration of an external operating apparatus of the substrate processing apparatus according to the embodiment of the invention.

The details of the external operating apparatus 30 are shown in FIG. 9.

As shown in FIG. 9, the external operating apparatus 30 has the previously described external display device 32, the external display controller 244, an input portion 288 which receives user's input data from the external operation screen 32a displayed in the external display device 32, and a temporary memory 292 which stores the input data received by the input portion 288 until the external display controller 244 transmits them to the main controller 14.

The external display controller 244 receives the input data (an input instruction) from the input portion 288, and transmits the relevant input data to the external display device 32 or the main controller 14.

Also, the external display controller 244 receives an instruction (a control instruction) to cause the process system controller 236 to execute an optional recipe, among the plurality of recipes stored in the ROM 250 or RAM 251. Also, the external display device 32 displays the optional recipe indicated by the instruction from the external display controller 244 on the external operation screen 32a. Furthermore, the external display device 32 displays an authority setting screen for setting a user's (operator's) operational authority, an editing screen for editing a recipe, or the like, on the external operation screen 32a, as will be described hereafter.

In the substrate processing system 1 configured in the way heretofore described, data for setting a recipe, data (input data) such as a user's (operator's) operational authority over the recipe, or the like, being input via the input portion 160 from various screens such as the main operation screen 18a and main parameter setting screen 18b displayed on the main display device 18 of the main operating apparatus 16, the input data (input instruction) are displayed on the main display device 18, are stored in the temporary memory 166, and furthermore, transmitted to the main controller 14 by the main display controller 240.

Also, in the same way, data for setting a recipe, data (input data) such as a user's (operator's) operational authority over the recipe, or the like, being input via the input portion 280 from various screens such as the sub-operation screen 52a and sub-parameter setting screen 52b displayed on the sub-display device 52 of the sub-operating apparatus 50, the input data (input instruction) are, as well as being displayed on the sub-display device 52, are stored in the temporary memory 284, and furthermore, transmitted to the main controller 14 by the sub-display controller 242.

Also, in the same way, data for setting a recipe, data (input data) such as a user's (operator's) operational authority over the recipe, or the like, being input via the input portion 288 from various screens such as the external operation screen 32a and external parameter setting screen 32b, displayed on the external display device 32 of the external operating apparatus 30, the input data (input instruction), are displayed on the external display device 32, are stored in the temporary memory 292, and furthermore, transmitted to the main controller 14 by the external display controller 244.

Furthermore, data are transmitted from the main controller 14 to the process system controller 236, and the process system controller 236 stores the input data in the RAM 251, and for example causes a setting input of a recipe stored in the ROM 250 or a user's (operator's) operational authority over the recipe, or the like to be finalized.

By the process system controller 236 starting the sequence program and, in accordance with the sequence program, for example invoking and executing, for example, a command of a recipe stored in the RAM 251, steps are sequentially executed and a control instruction for processing a substrate is transmitted to the temperature controller 252, gas controller 253, and pressure controller 254, via the I/O controller 255. The respective controllers such as the temperature controller 252 carry out the control of each portion (the heater 338, MFC 342, valve 348, and the like) in the substrate processing apparatus 10 in accordance with the control instruction from the process system controller 236

Also, data being transmitted to the conveyance system controller 234 from the main controller 14, the conveyance system controller 234 starts the sequence program steps are sequentially executed in accordance with the sequence program, and a control instruction is transmitted to the motor drive 262 and motor drive 263 via the I/O controller 264. The motor drives 262 and 263 carry out controls of the motor 350 and motor 352 in accordance with the instruction from the conveyance system controller 234.

In the substrate processing system 1 in the embodiment, for example, a user's (operator's) operational authority is set, for each predetermined file or command. Also, an operational authority of a group in which a plurality of users are registered is set for each predetermined file or command. For example, in a case in which an operational authority of a predetermined group over the process recipe is set in such a way that the process recipe can be edited, each user registered in the group can carry out a reference to and editing of a file which is the process recipe. For example the operational authority is set by an administrator (referred to also as a master user), and a name of a user and a password corresponding to the user are identified when the user executes an operation.

It is preferable that the individual user's operational authorities are set corresponding to an operating condition of the substrate processing apparatus. That is, for example a recipe editing by a line operator or the like is permitted at an off-line time, and the recipe editing by the line operator or the like (because the substrate processing apparatus operates in response to an instruction from a host computer or the like) is inhibited at an on-line time. Also, it is preferable that a recipe editing by a maintenance engineer or the like is permitted at the on-line time and when a problem occurs.

Next, a description of a method of setting a user's (operator's) operational authority over each recipe stored in the substrate processing apparatus 10. Will be given, based on FIGS. 10 to 13

Figure 10:
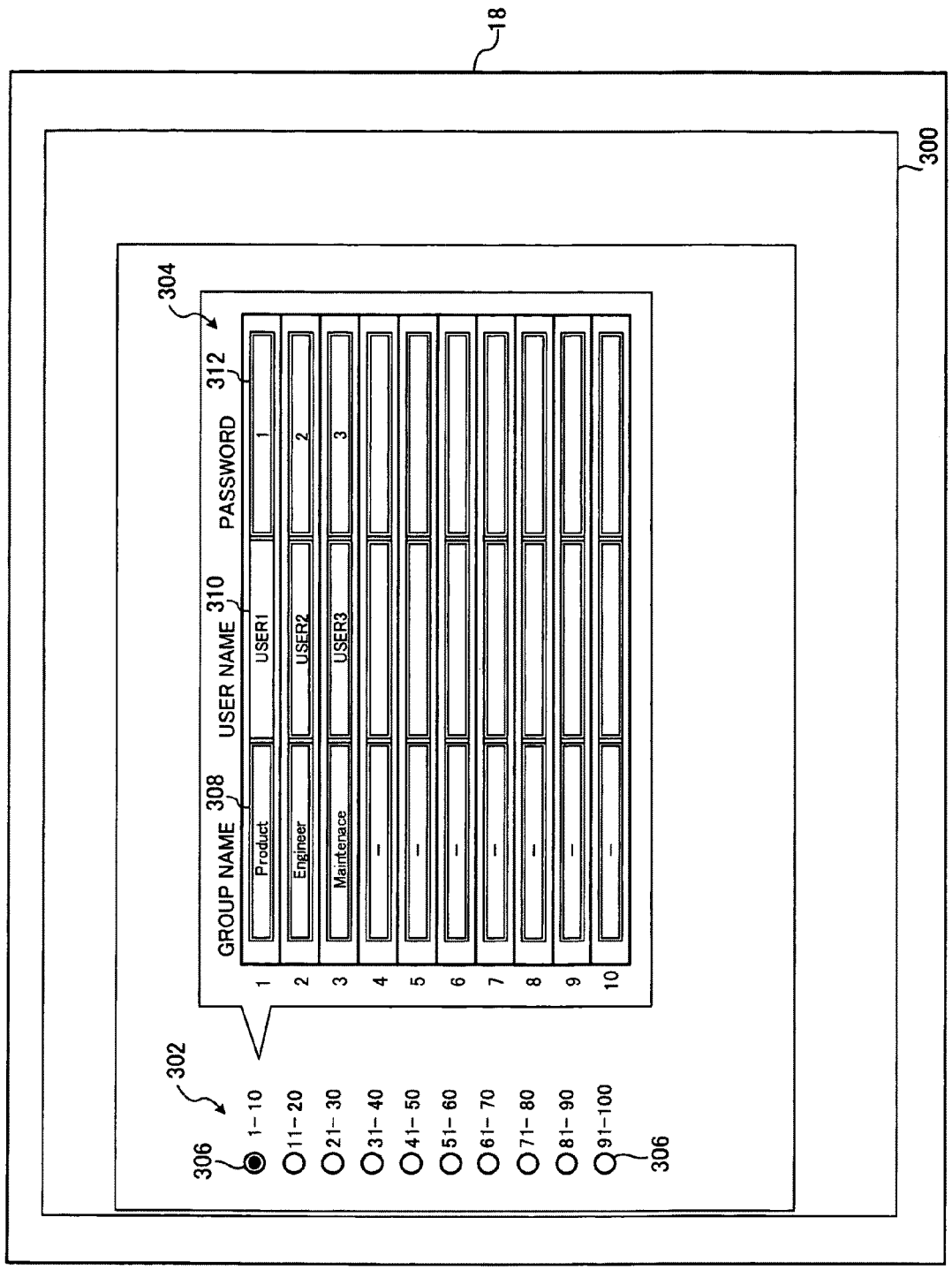
FIG. 10 is a view illustrating a user setting screen displayed as an operation display screen on a main display device of the substrate processing apparatus according to the embodiment of the invention.

FIG. 10 is a view illustrating a user setting screen 300 which, for example being operated by the administrator, is displayed as the main parameter setting screen 18b in the main display device 18 included in the main operating apparatus 16 of the substrate processing apparatus 10. A user name, a name of a group to which each user belongs, and a password corresponding to each user are displayed on the user setting screen 300 and it is possible to edit (update, correct, input, and so on) each item on the user setting screen 300.

As illustrated in FIG. 10, a table selection display portion 302 and a user setting table 304 are included in the user setting screen 300. The table selection display portion 302, having a plurality of selection portions 306, is arranged in such a way that, on selecting (depressing) any selection portion 306, a predetermined number of user setting tables 304 corresponding to the selection portion 306 are displayed.

A group name setting portion 308 for editing a user attribute called a group name, a user name setting portion 310 for editing a user name, and a password setting portion 312 for inputting a password corresponding to each user name, are included in the user setting table 304.

As the group name, a name of a group to which each user belongs, for example, Product, Engineer, Maintenance, Recovery, or the like, is input or selected. For example, a user who is a line operator is included in "Product", a user who is a process engineer is included in "Engineer", and a user who is a maintenance engineer is included in "Maintenance". A number of group names is fixed to 10 groups, for example. Alternatively, the number of group names may not be limited, and the group name can also be optionally set according to the need. For example, as the group name, it is also acceptable to give a name of an on-line engineer, a maintenance engineer, or the like.

The user name represents a name of a user, and for example the password is a string of characters formed of alphanumeric characters. As shown in FIG. 10, for example, the administrator inputs "USER 1" into the user name input portion 310, inputs "Product" into the group name input portion 308, and inputs "1" into the password input portion 312. Here, in the screen display, the password is to be displayed with "*" and the like character, as a matter of course.

Figure 11:
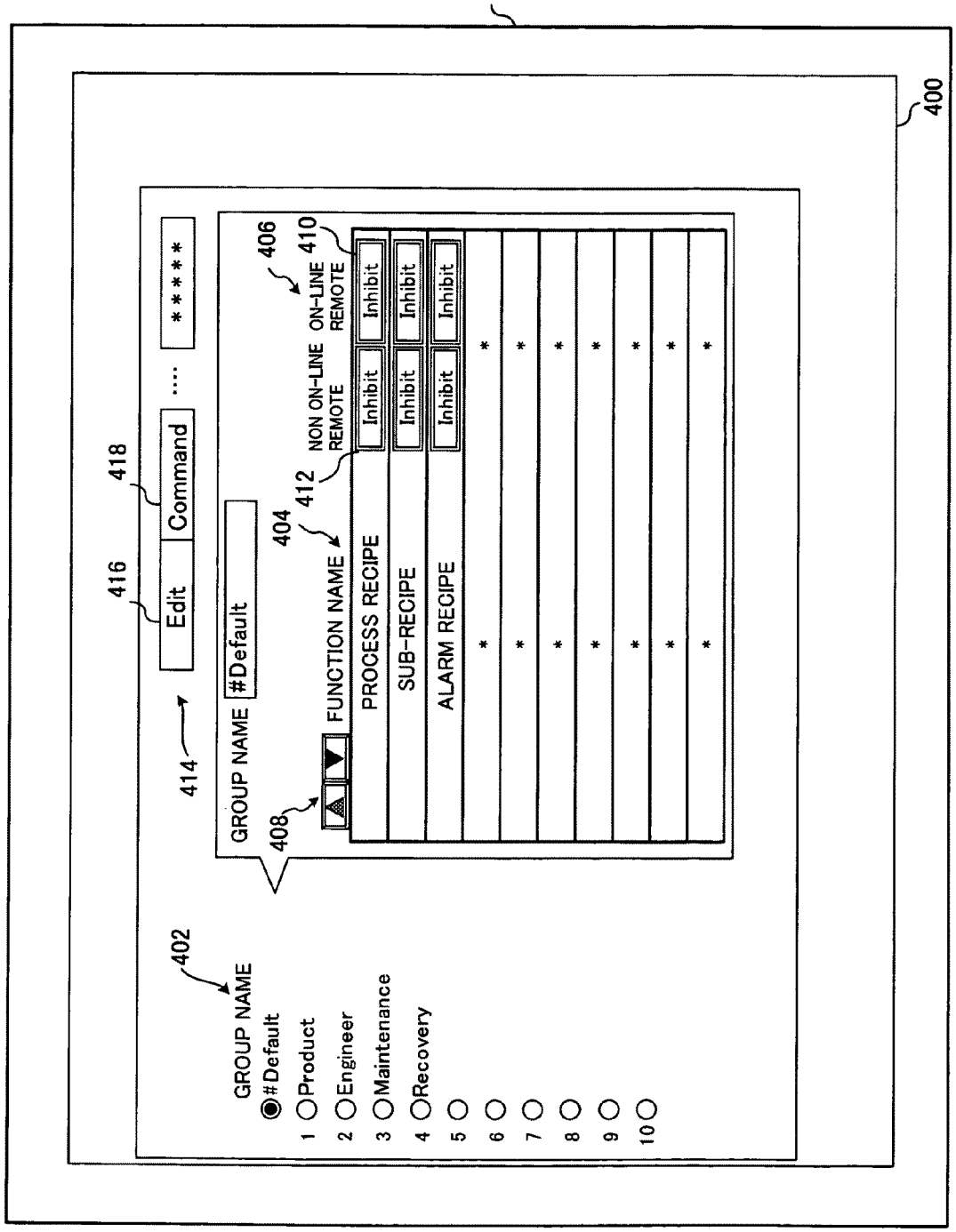
FIG. 11 is a view illustrating an authority setting screen displayed as an operation display screen on the main display device of the substrate processing apparatus according to the embodiment of the invention.

FIG. 11 is a view illustrating an authority setting screen 400 which, for example being operated by the administrator, is displayed as the main parameter setting screen 18b on the main display device 18 included in the main operating apparatus 16 of the substrate processing apparatus 10. On the authority setting screen 400, a user's (group's) operational authority over each recipe is set.

As illustrated in FIG. 11, a group name selection portion 402, which selects an object group name, a list display portion 404, which displays predetermined commands, a plurality of recipes, or the like, and an authority input portion 406, which inputs an operational authority of the relevant group over each of the plurality of recipes, are included in the authority setting screen 400. A plurality of group names set in the heretofore described user setting table 304 are displayed in the group name selection portion 402, and it is possible to select the object group name.

A plurality of recipes or the like stored as a file in the substrate processing apparatus 10 are displayed as a list in the list display portion 404. It is also acceptable to display, not only the recipes, but a file in which are set conditions for processing a substrate, or the like. For example, the process recipe, a sub-recipe, an alarm recipe, and the like are displayed in the list display portion 404. The list display portion 404 has a display switching button 408. It is possible to cause a switching display or a scroll display when necessary in the event that the list of the files cannot be displayed on one screen.

An on-line authority setting portion 410 and an off-line authority setting portion 412 are included in the authority setting portion 406. In a case in which the operating condition of the substrate processing apparatus 10 is on-line (on-line remote: a condition in which the substrate processing apparatus 10 operates in response to an instruction from the external operating apparatus 30 or the like), a group's (user's) operational authority over each recipe is input into (selected from) the on-line authority setting portion 410. In a case in which the operating condition of the substrate processing apparatus 10 is off-line (non on-line remote), a group's (user's) operational authority over each recipe is input into (selected from) the off-line authority setting portion 412.

A group's (user's) operational authority is set over each recipe and is any one of, for example, "Inhibit", "Read Only", "Edit", or "Exec".

Herein, "Inhibit" is an authority to inhibit an editing of and reference to a file such as a recipe, "Read Only" is an authority to inhibit an editing of, and permit a reference to, a file such as a recipe, "Edit" is an authority to permit an editing of and reference to a file such as a recipe, and "Exec" is an authority to permit an execution (a starting) of a recipe or the like.

Also, a button group 414 formed of a plurality of buttons is included in the authority setting screen 400. For example, an editing button 416, a command button 418, and the like are disposed in the button group 414. FIG. 11 is a view when the editing button 416 is depressed. On the command button 418 being depressed, although not shown, a plurality of commands by which authorities can be set are displayed in the list display portion 404. Then, it is also possible to set the command button on the authority setting screen 400.

Figure 12:
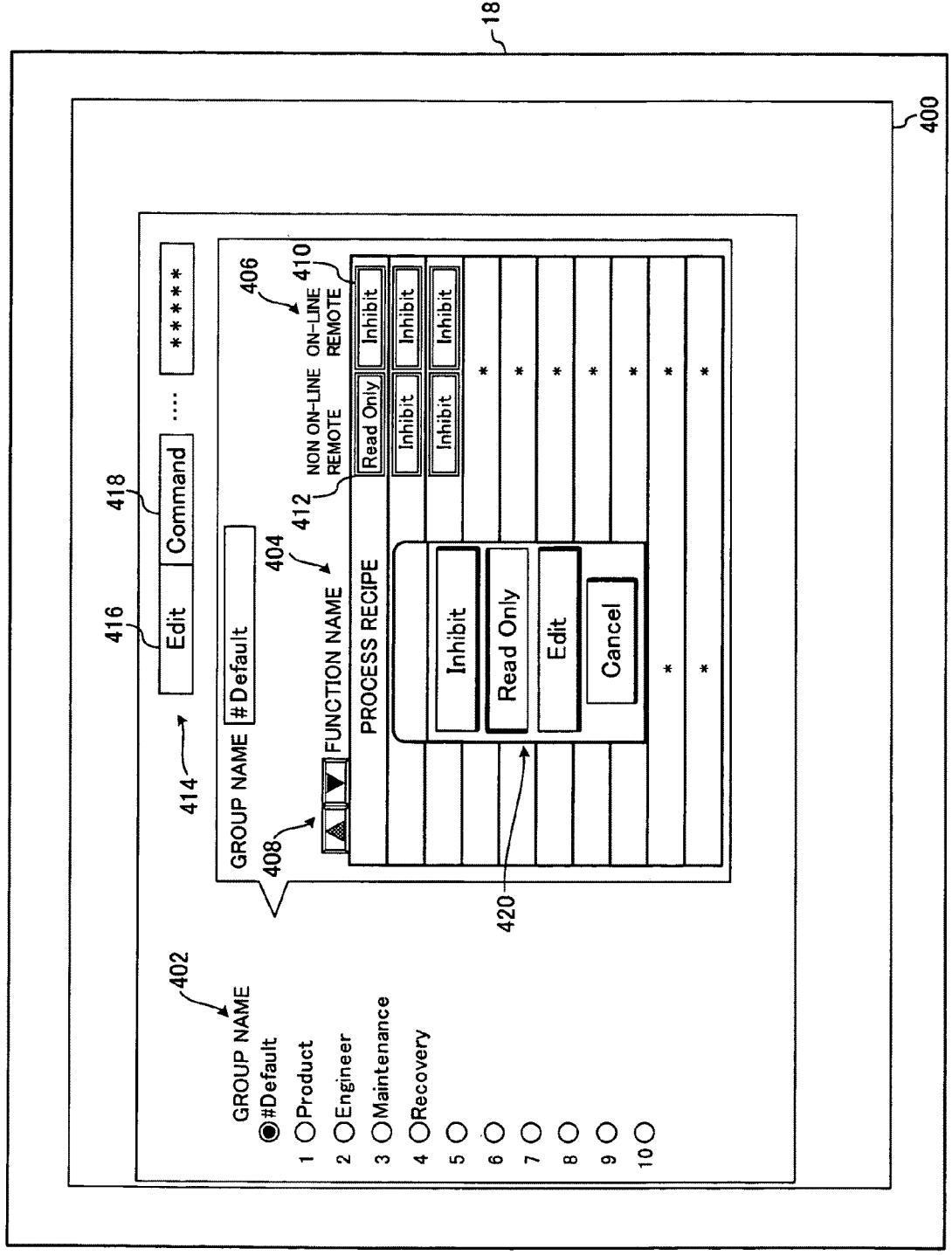
FIG. 12 is a view illustrating a setting of an authority over a predetermined recipe on the authority setting screen shown in FIG. 11.

FIG. 12 is a view illustrating a state where a selection screen 420 is newly displayed on the authority setting screen 400, by selecting the on-line authority input portion 410 or off-line authority input portion 412 corresponding to, for example, a predetermined recipe. The selection screen 420 is configured such that any one of "Inhibit", "Read Only", "Edit", and cancel can be selected after selecting the editing button 416.

For example, the administrator selects the editing button 416 on the authority setting screen 400, selects "Default" in the group name selection portion 402, selects the off-line authority input portion 412 corresponding to the process recipe, and selects "Read Only" on the selection screen 420. By this means, it is possible to carry out a setting of permitting a user belonging to a "Default" group to refer to the process recipe on a substrate processing apparatus 10 side at the off-line time.

Also, for example, on selecting "Engineer" or "Maintenance" in the group name selection portion 402 on the authority setting screen 400, and using the selection screen 420 to select "Edit" from the on-line authority setting portion 410 corresponding to the predetermined recipe, it is possible to carry out a setting of permitting a user belonging to an "Engineer" or "Maintenance" group to refer to, and edit, the predetermined recipe on the substrate processing apparatus 10 side at the on-line time.

Also, on the authority setting screen 400, for example, a user selects "Product" in the group name selection portion 402 and, by way of the selection screen 420, selects "Read Only" or "Inhibit" in the on-line authority setting portion 410 corresponding to a predetermined recipe. By this means, it is possible to carry out a setting of inhibiting a user belonging to the "Product" group from editing the predetermined recipe on the substrate processing apparatus 10 side at the on-line time.

Figure 13:
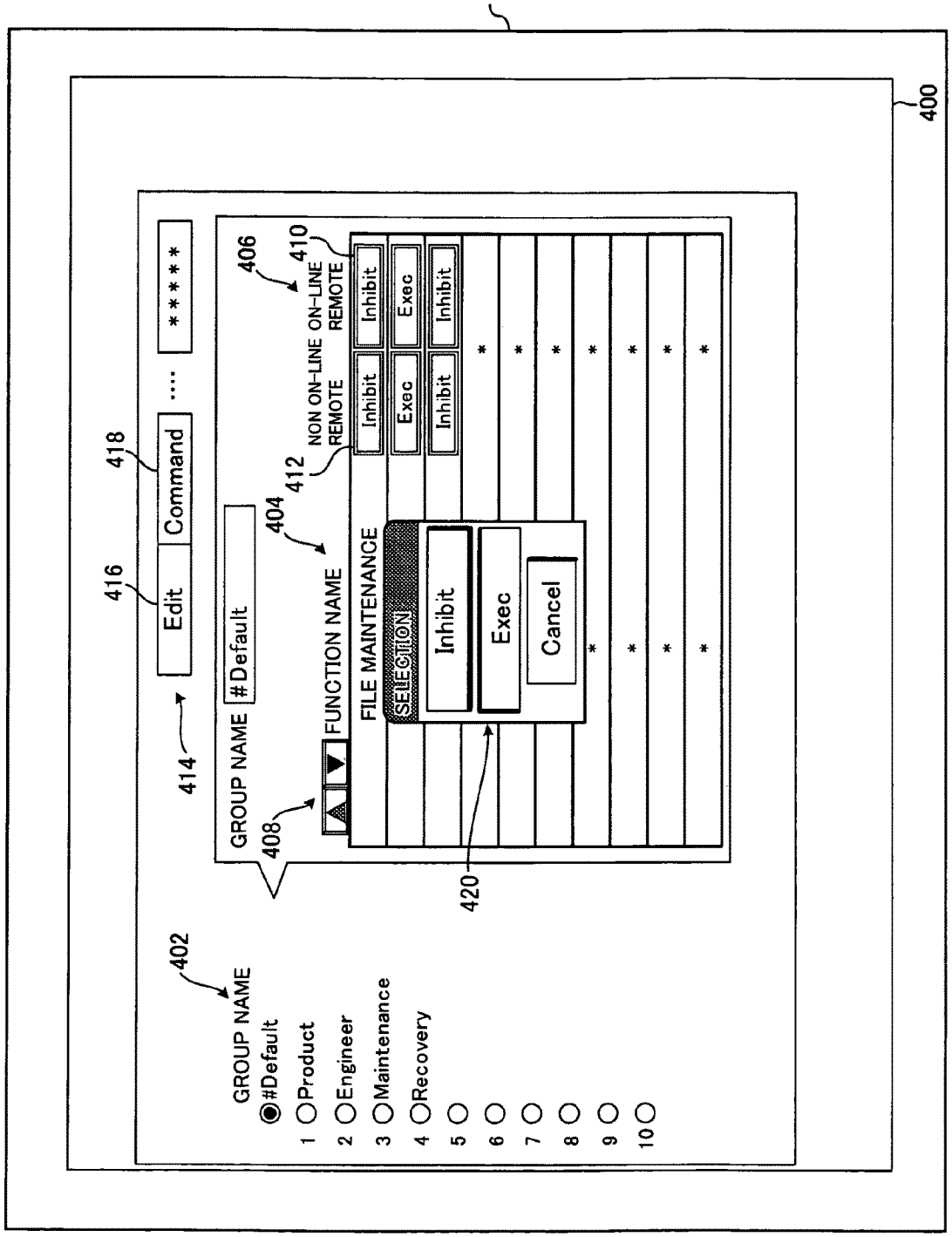
FIG. 13 is a view illustrating a setting of an authority over a predetermined command on the authority setting screen by means of a selection screen shown in FIG. 11.

FIG. 13 is a view illustrating a state where the selection screen 420 is displayed on the authority setting screen 400, by selecting the on-line authority setting portion 410 or off-line authority setting portion 412 corresponding to the displayed predetermined commands after selecting the command button 418. On the selection screen 420, it is possible to select any one of, for example, "Inhibit", "Exec", or cancel. Herein, it is possible, by "Inhibit"-ing the user belonging to the "Product" group from executing a conveyance command, among the predetermined commands, to arrange in such a way as not to display (or allow him/her to operate) a conveyance command button. For example, it is possible to prevent the user from executing, for example, a feeding of the FOUP 110 at the on-line time.

For example, on the authority setting screen 400, the administrator selects "Default" in the group name selection portion 402, selects the command button 418, selects the off-line authority setting portion 412 corresponding to a file maintenance command, and selects "Exec" on the selection screen 420. By this means, it is possible to carry out a setting of permitting the user belonging to the "Default" group to execute a file maintenance on the substrate processing apparatus 10 side at the off-line time. In this case, a command button for executing the file maintenance is displayed.

Herein, the file maintenance is a function for carrying out a maintenance operation of the files handled in the substrate processing apparatus. The file maintenance includes a file copying between an interior of a hard disc and an external storage medium such as a USB flash memory, and a file backup set in the system.

As heretofore described, the authority setting screen 400 is used as one main parameter setting screen 18b which sets a user's (operator's) operational authority over the predetermined files or commands stored in the ROM 250 or RAM 251.

Figure 14:
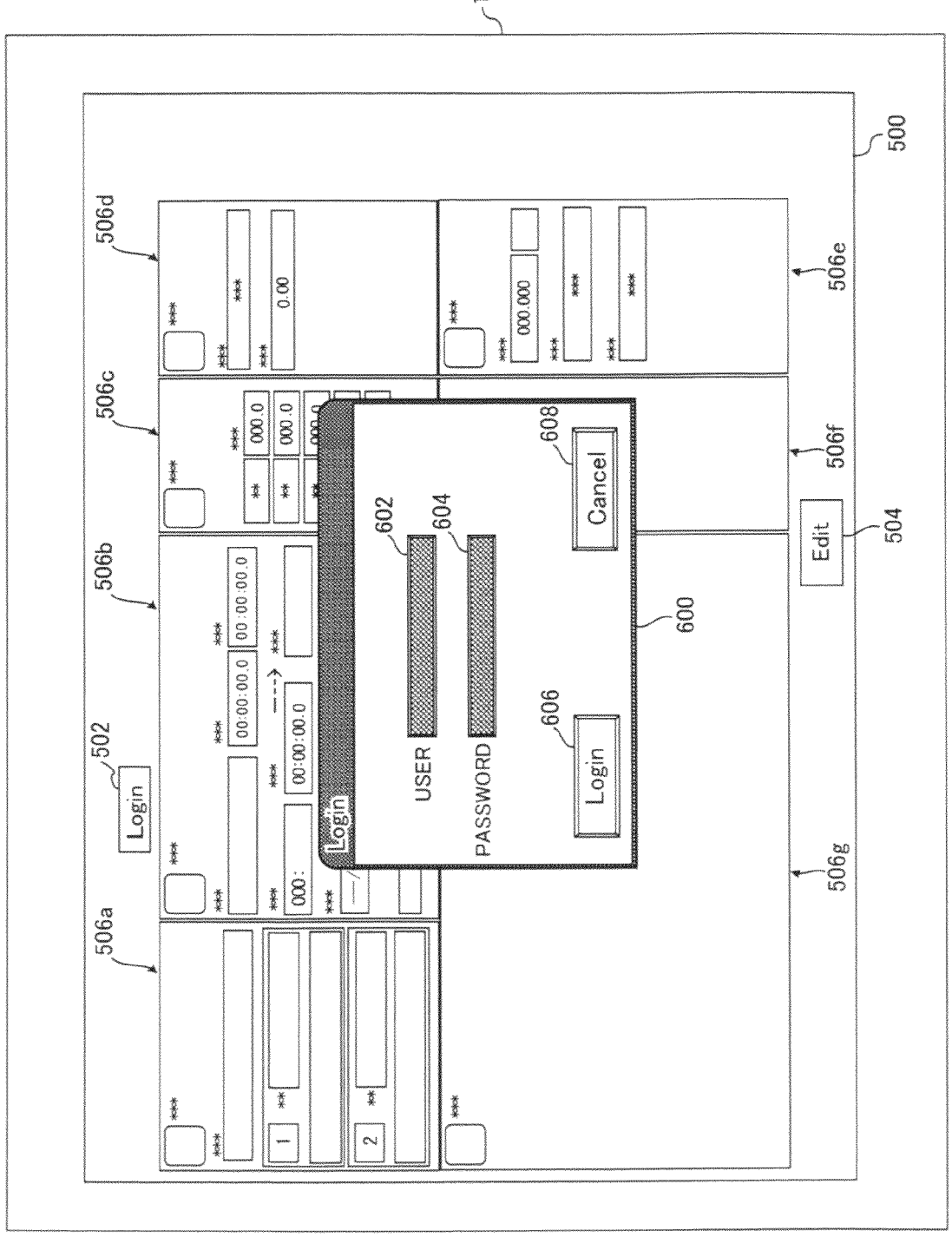
FIG. 14 is a view illustrating a login screen displayed as an operation display screen on the main display device of the substrate processing apparatus according to the embodiment of the invention.

FIG. 14 is a view illustrating a main screen 500 which, being operated by a user (an operator) for example is displayed as the main operation screen 18a on the main display device 18 included in the main operating apparatus 16 of the substrate processing apparatus 10.

As shown in FIG. 14, condition display portions 506a to 506g, which display a login button 502, an editing button 504, and conditions (for example, a temperature condition, a pressure condition, and the like) for processing a recipe and a substrate, are included in the main screen 500.

A login screen 600, by selecting (depressing) the login button 502, is displayed on the main screen 500. A user name input portion 602 for inputting a user name, a password input portion 604 for inputting a password corresponding to the user name, a login button 606 for executing a login, and a cancel button 608 for cancelling the login are included in the login screen 600. The user, on the login screen 600, carries out the login by inputting the user name into the user name input portion 602, inputting the password into the password input portion 604, and depressing the login button 606.

On selecting the editing button 504 of the main screen 500 after the login, an editing menu screen 700, to be described hereafter, is displayed.

Figure 15:
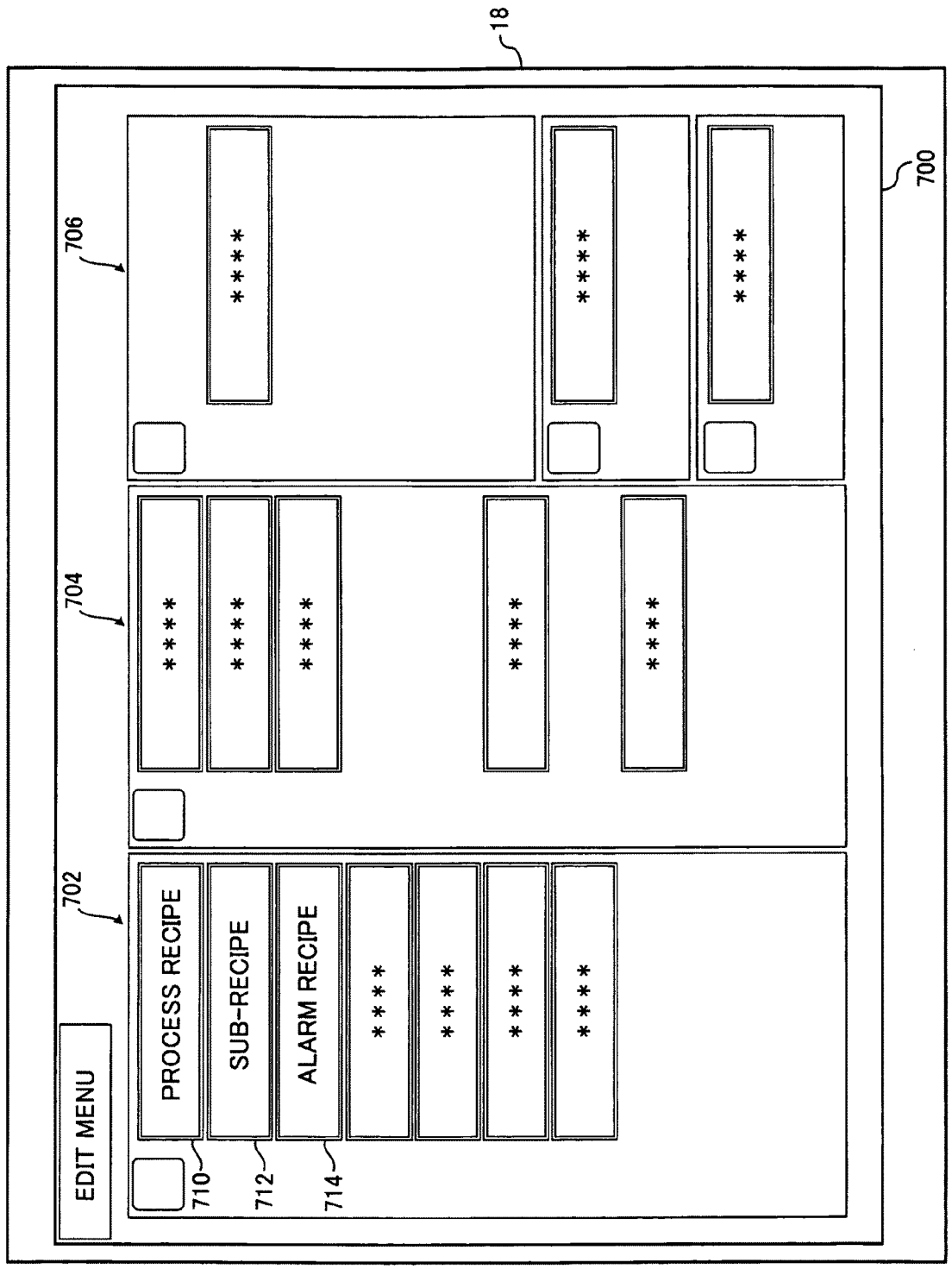
FIG. 15 is a view illustrating an editing menu screen displayed as an operation display screen on the main display device of the substrate processing apparatus according to the embodiment of the invention.

FIG. 15 is a view illustrating the editing menu screen 700 which, being operated by, for example, a user (an operator), is displayed as the main operation screen 18a on the main display device 18 included in the main operating apparatus 16 of the substrate processing apparatus 10.

For example, a recipe selection portion 702, a temperature setting selection portion 704, a pressure setting selection portion 706, and the like are included in the editing menu screen 700. For example, a process recipe selection button 710, a sub-recipe selection portion 712, an alarm recipe selection portion 714, and the like are displayed in the recipe selection portion 702. The process recipe selection button 710, sub-recipe selection portion 712, alarm recipe selection portion 714, and the like are displayed in the event that "Read Only", "Edit" and "Exec" are selected in the authority input portion 406 of the heretofore described authority setting screen 400. That is, a recipe, among the plurality of recipes stored in the ROM 250 or RAM 251, for which "Inhibit" is selected in the authority input portion 406, is not displayed on the editing menu screen 700.

On depressing (selecting) the process recipe selection button 710 on the heretofore described editing menu screen 700, an unshown recipe editing menu screen is displayed.

For example, a process recipe button, a variable parameter button, a recipe data range check parameter button, and the like are displayed on the recipe editing menu screen.

On selecting the process recipe button on the heretofore described recipe editing menu screen, an unshown process recipe list display screen is displayed.

The process recipe list display screen, displaying a list of a plurality of recipes relating to the process recipe, displays attributes for each recipe, such as a file name (a recipe name), an editing time and date, an editor, and a comment. For example, a file AAA edited by an editor ABC, a file BBB edited by an editor EFG, or the like is displayed on the process recipe list display screen. On selecting a file name displayed on the process recipe list display screen, a recipe editing screen 900 (to be described hereafter using FIG. 16) corresponding to the relevant file is displayed.

Figure 16:
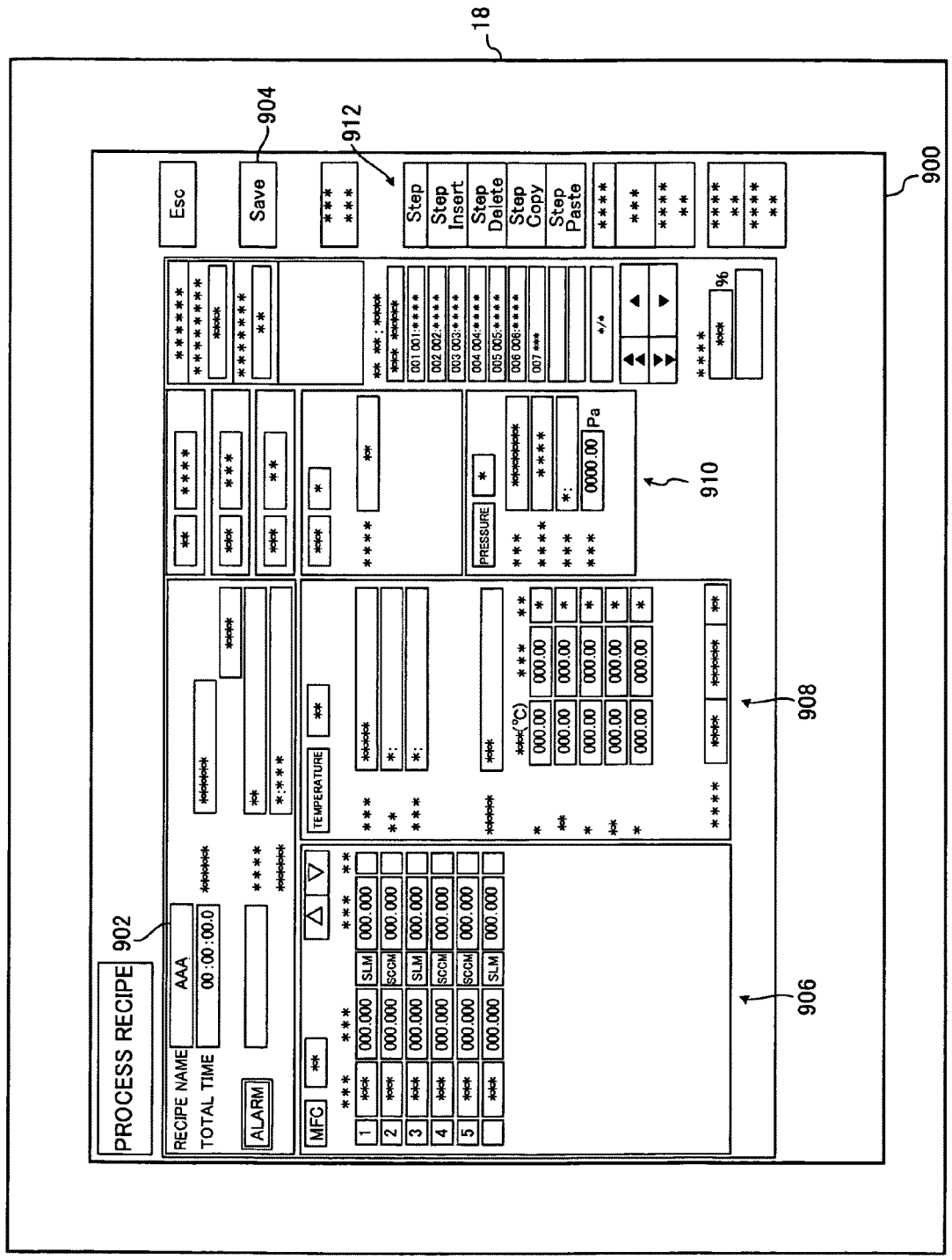
FIG. 16 is a view illustrating a recipe editing screen displayed as an operation display screen on the main display device of the substrate processing apparatus according to the embodiment of the invention.

FIG. 16 is a view illustrating the recipe editing screen 900 which, for example being operated by a user (an operator), is displayed as the main operation screen 18a on the main display device 18 included in the main operating apparatus 16 of the substrate processing apparatus 10. On selecting a predetermined file name (recipe name) displayed on the heretofore described process recipe list display screen, the recipe editing screen 900 is displayed. On the recipe editing screen 900, details of a predetermined recipe are displayed, and for example an instruction to edit (update) the predetermined recipe is input. The same figure shows a condition in which a recipe name AAA is selected on the heretofore described process recipe list display screen 850.

As shown in FIG. 16, a recipe name display portion 902, a save button 904, and a plurality of input portions which edit conditions for processing a recipe and a substrate a flow rate condition input portion 906 which sets a flow rate of a reaction gas or the like, a temperature condition input portion 908 which sets an in-furnace temperature or the like, a pressure condition input portion 910 which sets an in-furnace pressure or the like, a step input portion 912 which sets each step of a recipe, and the like, are included in the recipe editing screen 900. On the recipe editing screen 900, the user inputs each condition, command and the like in a recipe (for example, the recipe AAA) displayed in the recipe name display portion 902, into each input portion and, by depressing the save button 904, updates the recipe.

As heretofore described, the user setting screen 300, the authority setting screen 400, the main screen 500, the login screen 600, the editing menu screen 700 and the recipe editing screen 900 are displayed on the main display device 18 included in the main operating apparatus 16. Using these various screens, as well as the substrate processing system 1 being operated, the group parameter, which sets the group to which the user (operator) belongs, and the authority parameter, which regulates various operational authorities set corresponding to the group to which the user belongs, are set.

In the same way as this, the authority parameter, which regulates various operational authorities set corresponding to the group to which the user belongs, is set to the sub-display device 52 included in the sub-operating apparatus 50, and also to the external display device 32 of the external operating apparatus 30.

Here, the external operating apparatus 30 is disposed in the position separated from the substrate processing apparatus 10. Therefore, it may happen that it is not possible to confirm a situation of the substrate processing apparatus 10 and around the substrate processing 10. Accordingly, in the event of arranging in such a way that it is possible to carry out the same operations from the external operating apparatus 30 as from the main operating apparatus 16 and sub-operating apparatus 50, there is a risk of impeding a substrate processing, or causing a danger.

Therein, in the substrate processing system 1, particularly, restrictions are set to operations from the external operating apparatus 30, separately from the main operating apparatus 16 and sub-operating apparatus 50.

That is, the operations carried out from the external operating apparatus 30, in addition to being restricted using the authority parameter used in an operation from each of the main operating apparatus 16 and sub-operating apparatus 50, are restricted using the function restriction parameter. The function restriction parameter is set using a function restriction setting screen (FIG. 17, to be described hereafter) displayed on the external display device 32.

Herein, in order to impose a restriction on each operation carried out from the external operating apparatus 30, a logical product of the previously described authority parameter and function restriction parameter is calculated, and an authority to operate is set based on a result of the calculation.

With respect to the previously described authority parameter, the following values of "Inhibit", "Read Only" and "Edit" are set corresponding to each user or group to which the users belong;

| Inhibit | 0x00 |
| Read Only | 0x01 |
| Edit | 0x02 |

Also, with respect to the function restriction parameter, the following values of "Inhibit", "Read Only", "Edit" and "Read Only & Edit" are set for each operation;

| Inhibit | 0x00 |
| Read Only | 0x01 |
| Edit | 0x02 |
| Read Only & Edit | 0x03 |

Then, logical products of authority parameter values and function restriction parameter values are calculated by the main controller 14 and, in accordance with values thereof, restrictions are imposed on the operations carried out from the external operating apparatus 30. FIG. 19 is a diagram showing the logical products of the authority parameter values and function restriction parameter values. In FIG. 19, the user authority means the authority parameter with respect to the logged-in user.

FIG. 17 shows a screen when logging in as a user belonging to the Maintenance group, as one example of the function restriction setting screen 950 displayed on the external display device 32 of the external operating apparatus 30. As well as the function restriction parameter being set using the function restriction setting screen 950, the function restriction parameter set is displayed on the function restriction setting screen 950.

As shown in FIG. 17, an on-line function restriction setting portion 954 and an off-line (non on-line) function restriction setting portion 952 are included in the illustrated function restriction setting screen 950. A parameter restricting each function in the case in which the operating condition of the substrate processing apparatus 10 is on-line is input into the on-line function restriction setting portion 954. Also, a parameter restricting each function in the case in which the operating condition of the substrate processing apparatus 10 is off-line is input into the off-line function restriction setting portion 952.

The function restriction parameter, being set for each function, is any one of "Inhibit", "Read Only", "Edit" or "Read Only & Edit", as previously described, and 0 in the event of "Inhibit", 1 in the event of "Read Only", 2 in the event of "Edit", and 3 in the event of "Read Only & Edit" are displayed in the off-line function restriction setting portion 952 and on-line function restriction setting portion 954.

A more specific description will be given of the restrictions of the operations carried out from the external operating apparatus 30.

For example, a restriction imposed on a process recipe editing in a case of logging into the external operating apparatus 30 as a user belonging to the Maintenance group, taking it that an authority of the Maintenance group is "Read Only". Since the restriction of the process recipe editing is "Read Only & Edit", as shown by reference number 956 in FIG. 17, the user's operational authority is set based on a logical product "0x01" of values "0x01" and "0x03" of the two, and becomes "Read Only".

Also, for example, as shown by reference number 958 in FIG. 17, a restriction of an alarm condition editing being "Inhibit", a value thereof is "0x00". For this reason, even in the event of logging in as a user belonging to any one group, a logical product of a value of an authority of the group is always "0x00", and the operation from the external operating apparatus 30 becomes "Inhibit", regardless of a group to which the user belongs.

Also, for example, supposing that a user is logged into the external operating apparatus 30 as a user belonging to the Maintenance group, the authority of the Maintenance group is "Edit" and there is an operation A a function restriction of which is "Read Only & Edit". In this case, a restriction imposed on the operation A becomes "Edit" as a logical product of an authority parameter value "0x02" of the group to which the user belongs and a function restriction parameter value "0x03" is "0x02".

Next, a description will be given of a control processing of the substrate processing system 1 according to the embodiment of the invention.

Figure 18:
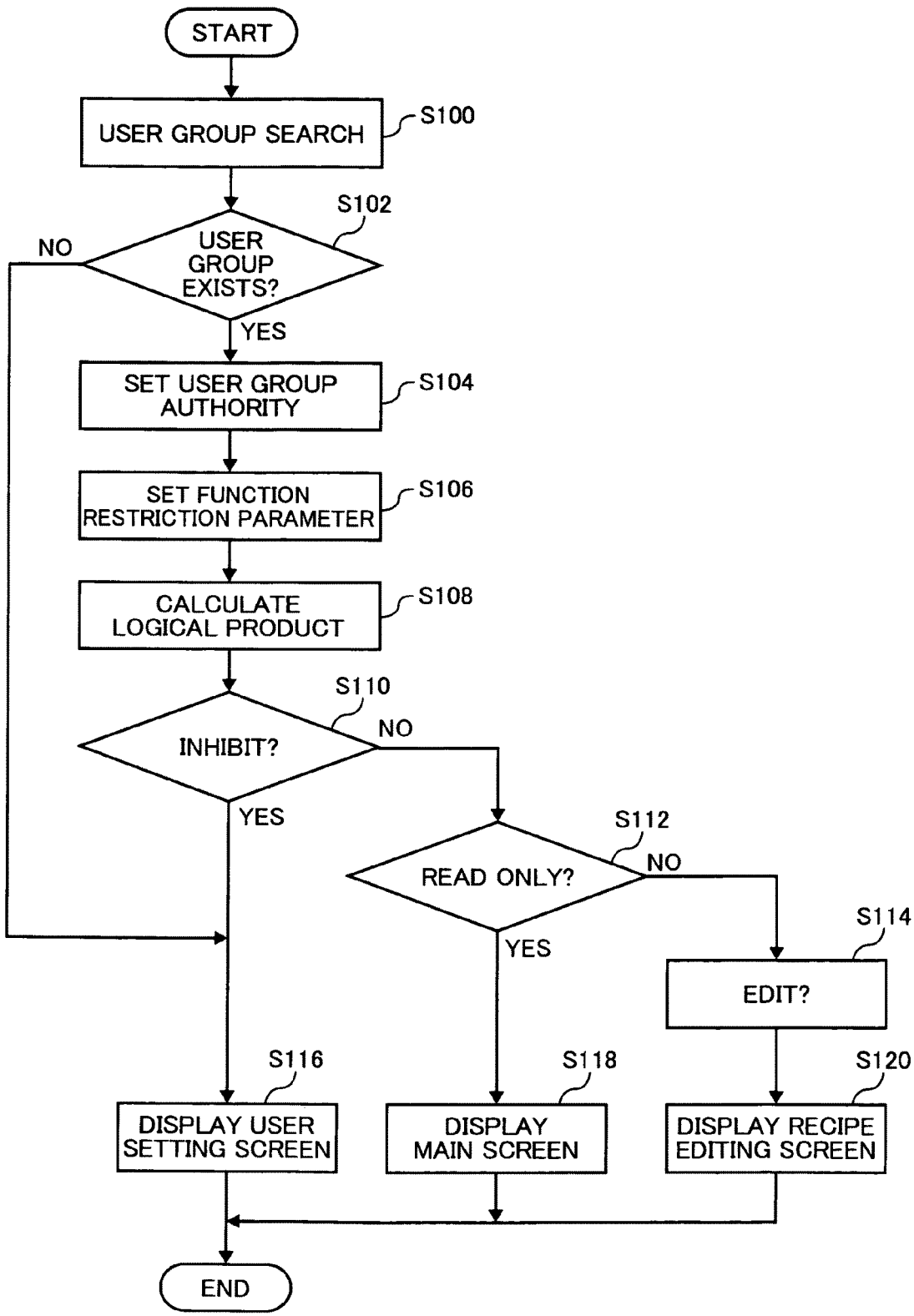
FIG. 18 is a flowchart showing a control processing which, being carried out by the substrate processing apparatus according to the embodiment of the invention, is carried out particularly when an operation is carried out from the external operating apparatus.

FIG. 18 is a flowchart showing a control processing carried out by the substrate processing system 1 according to the embodiment of the invention, in particular, a control processing when carrying out an operation from the external operating apparatus 30.

As shown in FIG. 18, in step S100, the main controller 14, as well as receiving a user name input from the external display device 32, and a password corresponding to the user name, carries out a search processing as to which user group that user belongs to.

In the next step S102, the main controller 14 determines whether or not the user group found in step 100 exists. Specifically, the main controller 14 determines whether or not the user group found in step S100 is, for example, identical to one stored in the ROM 250, RAM 251 or the like and, if it is determined that it is identical, shifts to a process of the next step S104. On the other hand, if it is determined that it is not identical, the main controller 14 shifts to step S116.

In step S104, an authority of the user group determined to exist in step S102 is set. Specifically, the main controller 14 sets an authority stored in, for example, the ROM 250, RAM 251, or the like, for the user group to which the user name input from the external display device 32 belongs. At this time, in the authority setting, in a case in which the operating condition of the substrate processing apparatus 10 is on-line or off-line, an operational authority of the user over each recipe in each case is set for the appropriate user group.

Also, in the authority setting in step S104, the authority is set as any one of "Inhibit" taking the value "0x00", "Read Only" taking the value "0x01", or "Edit" taking the value "0x02", as previously described.

In the next step S106, when the operation is carried out from the external operating apparatus 30, the operational authority is restricted as a unique process. Specifically, the main controller 14 carries out a setting of the function restriction parameter stored in, for example, the ROM 250, RAM 251, or the like, for an operation input from the function restriction setting screen 950 displayed on the external display device 32.

In the setting of the function restriction parameter in step S106, the authority is set as any one of "Inhibit" taking the value "0x00", "Read Only" taking the value "0x01", "Edit" taking the value "0x02", or "Read Only E Edit" taking the value "0x03", as previously described.

In the next step S108, a logical product of the authority parameter value set in step S104 and the function restriction parameter value set in step S106 is calculated by the main controller 14.

In step S110, step S112, and step S114, it is determined, based on the logical product calculated in step S108, whether the authority is "Inhibit" taking the value "0x00", "Read Only" taking the value "0x01", or "Edit" taking the value "0x02". The main controller 14 moves to step S116 if it is determined that it is "Inhibit", moves to step S118 if it is determined that it is "ReadOnly", and moves to step S120 if it is determined that it is "Edit".

In step S116, the main controller 14 causes the external display device 32 to display a screen corresponding to the operation-restricted to "Inhibit". Specifically, for example, a condition in which a screen equivalent to the user setting screen 300 remains displayed on the external display device 32 is obtained, preventing a file such as a recipe from being edited and referred to.

In step S118, the main controller 14 causes the external display device 32 to display a screen corresponding to the operation restricted to "Read Only". Specifically, for example, a screen equivalent to the main screen 500 is displayed on the external display device 32, enabling an operator to refer to conditions (for example, a temperature condition, a pressure condition, and the like) for processing a recipe and a substrate.

In step S120, the main controller 14 causes the external display device 32 to display a screen corresponding to the operation restricted to "Edit". Specifically, for example, the recipe editing screen 900 is displayed on the external display device 32, enabling a relevant user to edit (update) the process recipe.

As the operation from the external operating apparatus 30 is restricted by setting the function restriction parameter, as heretofore described, it is possible to arrange in such a way as not to allow an operation likely to impede a production, an operation likely to cause a danger in the event that it is carried out, for example, from a position in which the condition of the substrate processing apparatus 10 cannot be visually confirmed, or the like, to be carried out from the external operating apparatus 30.

Also, in the embodiment of the invention, a description has been given of the method of searching for a group to which a user who logs in belongs, but the invention is not limited to the embodiment. In the event that a user who logs in is fixed for the external operating apparatus 30, it is also acceptable that a user ID and password with which to log in are decided on in advance and, when fixed login information (the user ID and password) is input by means of an operation from the relevant external operating apparatus 30, the main controller 14 determines that the user has logged in from the external operating apparatus 30. However, in this case, it is necessary that user information including the user ID and password is stored as a parameter in advance in the memory of the main controller 14.

Also, according to the invention, it is possible to cause each of the main display device 18, sub-display device 52, and external display device 32 to output a different display, and it is possible to cause the substrate processing apparatus 10 or the like to carry out a different operation from each of the main operation screen 18a displayed on the main-display device 18, the sub-operation screen 52a displayed on the sub-display device 52, and the external operation screen 32a displayed on the external display device 32.

Also, as it is possible to output a different display, as well as implementing a different operation, in each apparatus, as in examples to be described hereafter, various operations become possible. For example, as it is possible to carry out a setup operation, in conjunction with a different operation, in each apparatus, it is possible to shorten a time required for the setup. As an operation, a JOB compilation and a process progress-confirmation are implemented in the sub-display controller 242, a parameter editing and reference, a production and impediment condition, and a trace logging confirmation are implemented in the main display controller 240, and a parameter reference, a production and impediment condition, and a trace logging confirmation are implemented in the external display controller 244.

In particular, as it is possible, by using the external display controller 244, to carry out an operation without, as far as possible, entering the clean room, it is possible not only to improve an operating efficiency, but also to contribute to making an interior of the clean room unmanned. Also, as screen configurations of the external display controller 244 and main display controller 240 are made the same as far as possible, it is possible to carry out the same operation as in the clean room, improving an operability.

FIG. 20 shows operations which can be carried out by each operating apparatus. The operations include a carrier carrying in/out, a JOB compilation, a recipe compilation, a parameter compilation, a table compilation, a log data reference, an apparatus condition reference, a production information reference, an impediment information reference, a trace data reference, a file maintenance, a remote command, and the like. Basically, the heretofore mentioned operations become operable at the same time by each display controller. By this means, it is possible to obtain working effects, such as the improvement in the operability, and the improvement in the operating efficiency. Herein, the apparatus information refers to a transfer machine condition, a JOB progress, a process condition (a condition of a temperature, pressure, MFC or the like), and the like, the file maintenance refers to a file copying/movement from an HD (a hard disc) to an HD, a file copying/movement from an HD to a USB memory which is an external storage medium, a file copying/movement from a USB memory to an HD, a backup/restoration of a system file, and the like. The remote command refers to a transfer machine related command to load/unload the boat, a command to change a PM (process module) condition, and a command to change a system A condition.

EXAMPLE 1

Next, a description will be given of the examples of the invention.

In an example 1 of the invention, it is possible to implement a conveyance system teaching in one sub-display controller 242, as well as implementing a file reference operation in each other display controller 240 and 242. Consequently, as a data analysis and a teaching operation are concurrently implemented, it is possible to improve the operating efficiency, and shorten the time required for the setup. Also, in the event of a process which does not impede a substrate processing, it is possible to concurrently implement an external display controller 244 analysis of an abnormality, which has occurred in an apparatus, and a conveyance system setup. Herein, the analysis is defined as a process of referring to an information file of a production which has stopped irregularly due to an impediment occurrence, referring to various files while switching between screens on an operation screen, and determining a cause of the impediment occurrence. Also, a process which does not impede a production is mainly an operation of a monitor system screen. To illustrate this, the monitor system screen, being a screen transferable from a system main screen and a PM main screen, includes a monitor screen for a conveyance, a job, a recipe progress, a gas flow rate, a temperature, a pressure, a special sequence or the like, a trend/trace screen for history information such as impediment information or production information, or the like.

EXAMPLE 2

In an example 2, in a case in which an operator who has logged in is at a level of having an authority to edit a recipe (a file), it is possible to implement the conveyance system teaching in one sub-display controller 242, as well as implementing a file editing operation in each other display controller 240 and 242. Consequently, as the recipe editing and teaching operation are concurrently implemented, it is possible to improve the operating efficiency, and shorten the time required for the setup. However, as the teaching is in progress, maintenance and adjustment recipes, and parameters are edited. It is possible to concurrently implement a redoing of the teaching and a recipe correction operation before executing an adjustment recipe, and executing a next adjustment recipe in order to correct a processing result. Therefore, in the event that the adjustment recipes have to be executed over and over again, by concurrently implementing the teaching and the recipe editing, it is possible, as a result, to suppress the time required for the setup.

EXAMPLE 3

In an example 3, in a case in which an operator who has logged in is at a high operational level in the same way as in the example 2, in the event of different recipes, it is possible to compile the recipes at the same time in each control display portion. Consequently, as it is possible to compile the recipes in the external display controller 244, an operation becomes possible without entering the clean room, improving the operating efficiency.

EXAMPLE 4

In an example 4, in a case in which an operator who has logged in is at a high operational level in the same way as in the example 2, it is possible to simultaneously implement the process progress confirmation in the sub-display controller 242, the parameter editing in the main display controller 240, and the impediment information reference in the external display controller 244.

EXAMPLE 5

In an example 5, it is possible to refer to a conveyance system condition in the main display controller 240 while confirming a process progress in the external display controller 244. Alternatively, contrarily, it is possible to confirm the process progress in the main display controller 240 while referring to the conveyance system condition in the external display controller 244. In this way, as it is possible to carry out a different operation in each operating apparatus, it is possible to take a prompt action even in the event that, for example, an abnormality occurs in the conveyance system.

EXAMPLE 6

In an example 6, it is possible to refer to the parameter editing and reference, and the production and impediment condition, in the external display controller 244 while confirming a process progress in the sub-display controller 242. By this means, it is possible to implement an analysis of history information of a production, an impediment, and the like, outside the clean room while executing a recipe, and it is possible to carry out a parameter correction in accordance with a result of the analysis. Consequently, it is possible to carry out an editing of a next recipe while confirming the recipe progress. It is particularly necessary to repeatedly execute the adjustment recipes at a setup time. It becomes possible, by carrying out an analysis while executing the previous recipe, to directly execute the next recipe even when the previous recipe is finished, and as a result it is possible to shorten the time required for the setup.

EXAMPLE 7

In an example 7, an operation in the sub-display controller 242 too, in the same way as the operation in the external display controller 244, can also be restricted using the function restriction parameter. By this means, in a case of implementing the maintenance operation in the sub-display controller 242, it is possible to suppress an erroneous recipe editing in the main display controller 240. Particularly, even in the event that an operation of editing a recipe in order to execute the adjustment recipes a plurality of times, an operation of carrying out a conveyance system re-teaching or the like, and setting a predetermined parameter, or the like, is necessary on an external display controller 244 side at the setup or maintenance time, it is possible to prevent an unnecessary recipe editing from being carried out on a main display controller 240 side. In this way, it is also possible to improve a safety of the apparatus by making possible only basic operations (reference operations such as the parameter reference, apparatus information reference, and trace data reference), and rendering impossible a recipe editing, a parameter editing, a file maintenance, an operation of editing a remote command or the like, an operation of changing an apparatus condition, and the like.

EXAMPLE 8

In an example 8, an arrangement is adopted such that, even in the event that an operator who has logged in is at a high operational level, in the same way as in the example 2, it is possible to change an authority of an operator who has not logged in. By so doing, it is possible to cause the operator who has not logged in to implement only an information (file) reference without causing him/her to implement a remote command or a file reference. Specifically, in the event that there is a login in some display controller, among the display controllers, logging-in from any other display controller is not permitted, making possible only the basic operations (the reference operations such as the parameter reference, apparatus information reference, and trace data reference), and rendering impossible the recipe editing, the parameter editing, the file maintenance, the operation of editing the remote command or the like, the operation of changing the apparatus condition, and the like. In this way, the safety of the apparatus can be improved.

In a case in which an operator who has logged in is at a low operational level, caution is necessary because it may happen that he/she can only refer to the heretofore mentioned maintenance and adjustment recipes. In this case, it is necessary that the operator who has once logged in logs out, and has an operator at a high operational level log in. Also, in a case in which an operator at a high operational level who has logged in logs in from the external display controller 244, even when only the basic operations (the reference operations such as the parameter reference, apparatus information reference, and trace data reference) are possible under a restriction using the function restriction parameter, another operator who has not logged in can implement the recipe editing, the parameter editing, the file maintenance, and the operation of editing the remote command or the like, in the main display controller 240.

That is, as the operator who has not logged in operates the sub-display controller 242, it being determined, based on only an operational authority of a default user (a user who has not logged in), whether or not the recipe editing is possible, the recipe editing becomes possible in the event that the default user's authority is 2 (Edit), the recipe reference becomes possible in the event of 1 (Read only), and the reference becomes impossible in the event of 0 (Inhibit). In the embodiment, irrespective of whether or not an operator has logged in from some controller, regarding the main display controller 240 and sub-display controller 242, a determination is made based on only an authority of a user who logs in, while regarding the external display controller 244, a determination is made based on a logical product of the authority of the user who logs in and the function restriction parameter.

The invention can be applied as the substrate processing apparatus to, not only the semiconductor manufacturing apparatus, but also an apparatus which processes a glass substrate, such as that of an LCD device. A film formation process includes, for example, a CVD, a PVD, a process of forming an oxide film or a nitride film, a process of forming a film containing metal, or the like. Also, in the embodiment, a description has been given of the vertical type processing apparatus, but the invention can also be similarly applied to a single-wafer type apparatus, and furthermore, to an exposure apparatus, a lithography apparatus, a coating apparatus, or the like.

The invention has the items described in the claims as features but, furthermore, items appended below are also included therein.

Appendix 1

A substrate processing system comprising:

a substrate processing mechanism which processes a substrate;

a controller which controls at least the substrate processing mechanism;

a memory in which is stored information (a user ID and a password) on a user who operates the substrate processing mechanism; and a display portion which, on login information of a user being input, collates the login information with the user information stored in the memory, and displays an operation screen corresponding to an operational level (an operational authority) of the user.

Appendix 2

A substrate processing system comprising:

a file which includes a plurality of recipes in which is described a procedure of processing a substrate;

a memory in which is stored user information of a user who executes the file;

a controller which controls in such a way as to subject the substrate to a predetermined process by executing the file; and a main display portion, connected to the controller, on which is displayed an operation screen for executing at least the file, wherein the controller, on login information of a user being input from the main display portion, collates the login information with the user information stored in the memory, and causes the main display portion to display an operation screen corresponding to an operational level (an operational authority) of the user.

Appendix 3

A substrate processing system comprising:

a file which includes a recipe in which is described a procedure of processing a substrate;

a memory in which is stored user information (a user ID and a password) of a user who executes the file;

a controller which controls in such a way as to subject the substrate to a predetermined process by executing the file; and a main display portion, connected to the controller, on which is displayed an operation screen for executing at least the file, wherein the main display portion can be disposed in a position separated from the controller, and can be connected to an external display portion, on which is displayed an operation screen for executing at least the file, via a communication network, and the controller, on login information of a user being input, collates the login information with the user information stored in the memory, and causes the external display portion to display an operation screen corresponding to an operational level (an operational authority) of the user, whereby it is possible to cause display screens displayed on the main operation screen and external operation screen to be displayed differently from one another.

Appendix 4

A substrate processing system comprising:

a file which includes a recipe in which is described a procedure of processing a substrate;

a memory in which are stored user information (a user ID and a password) of a user who executes the file, and a function restriction parameter which restricts a function which the user operates;

a controller which controls in such a way as to subject the substrate to a predetermined process by executing the file; and a main display portion, connected to the controller, on which is displayed an operation screen for executing at least the file, wherein the main display portion can be disposed in a position separated from the controller, and can be connected to an external display portion, on which is displayed an operation screen for executing at least the file, and the controller, on login information of a user being input from the external display portion, collates the login information with the user information stored in the memory, and causes the external display portion to display an operation screen corresponding to an operational level (an operational authority) of the user as the operation screen.

The invention can be applied to a substrate processing system, a substrate processing apparatus, and a substrate processing method, which process a substrate such as a semiconductor wafer or a glass substrate.

What is claimed is:

1. A substrate processing system comprising:
    a controller which controls at least a substrate processing mechanism for processing a substrate;
    a memory which stores an authority parameter, which regulates various operational authorities set in advance corresponding to a user who operates at least the substrate processing mechanism, and a function restriction parameter, which restricts a function which the user operates;
    a first display portion which is disposed in a vicinity of the substrate processing mechanism;
    a second display portion which is disposed in a position separated from the substrate processing mechanism;
    wherein the controller,
        on login information of the user being input from the first display portion, collates the login information with the authority parameter stored in the memory, and uses the authority parameter to cause the first display portion to display an operation screen corresponding to an operational authority of the user, and
        on login information of the user being input from the second display portion, compares the function restriction parameter set in advance in the memory with the authority parameter, specified in the login information corresponding to the operational authority of the user, and uses a matched operational authority based on the authority parameter and the function restriction parameter, to cause the second display portion to display an operation screen corresponding to the matched operational authority of the user.

2. A substrate processing apparatus comprising:
    a controller, wherein the controller,
        controls at least a substrate processing mechanism for processing a substrate,
        is connected to a first display portion which is disposed in a vicinity of the substrate processing mechanism, and
        is connected to a second display portion which is disposed in a position separated from the substrate processing mechanism; and
    a memory which stores an authority parameter, which regulates various operational authorities set in advance corresponding to a user who operates at least the substrate processing mechanism and a function restriction parameter, which restricts a function which the user operates; wherein the controller,
        on login information of the user being input from the first display portion, collates the login information with the authority parameter stored in the memory, and uses the authority parameter to cause the first display portion to display an operation screen corresponding to an operational authority of the user, and
        on login information of the user being input from the second display portion, compares the function restriction parameter set in advance in the memory with the authority parameter, specified in the login information corresponding to the operational authority of the user, and uses a matched operational authority based on the authority parameter and the function restriction parameter, to cause the second display portion to display an operation screen corresponding to the matched operational authority of the user.

3. The substrate processing system according to claim 1, wherein the controller can cause each of the first display portion and the second display portion to output a different display.

4. The substrate processing apparatus according to claim 2, wherein the controller can cause each of the first display portion and the second display portion to output a different display.

5. The substrate processing system according to claim 1, wherein the controller carries out a different control in response to each of an instruction from the first display portion and an instruction from the second display portion.

6. The substrate processing apparatus according to claim 2, wherein the controller can cause each of the first display portion and the second display portion to output a different display.

7. The substrate processing system according to claim 1, wherein the controller displays an authority setting screen for setting user's operational authority on the first display portion or the second display portion.

8. The substrate processing apparatus according to claim 2, wherein the controller displays an authority setting screen for setting user's operational authority on the first display portion or the second display portion.

9. The substrate processing system according to claim 2, wherein the user's operational authority is set for each predetermined file or command.

10. The substrate processing apparatus according to claim 8, wherein the user's operational authority is set for each predetermined file or command.

11. The substrate processing system according to claim 7, wherein the operational authority of a group in which a plurality of users is registered is set for each predetermined file or command.

12. The substrate processing apparatus according to claim 8, wherein the operational authority of a group in which a plurality of users is registered is set for each predetermined file or command.

13. The substrate processing system according to claim 7, wherein the user's operational authority is set corresponding to an operating condition of the substrate processing apparatus.

14. The substrate processing apparatus according to claim 8, wherein the user's operational authority is set corresponding to an operating condition of the substrate processing apparatus.

15. The substrate processing system according to claim 11, wherein the group in which a plurality of users belongs is any one of Product, Engineer, Maintenance, and Recovery.

16. The substrate processing apparatus according to claim 12, wherein the group in which a plurality of users belongs is any one of Product, Engineer, Maintenance, and Recovery.

17. The substrate processing system according to claim 11, wherein the group's or the user's operational authority is set over each recipe on the authority setting screen and is any one of "Inhibit", "Read Only", "Edit", or "Exec".

18. The substrate processing apparatus according to claim 12, wherein the group's or the user's operational authority is set over each recipe on the authority setting screen and is any one of "Inhibit", "Read Only", "Edit" or "Exec".

* * * * *